US012595361B2

(12) United States Patent
Landa et al.

(10) Patent No.: US 12,595,361 B2
(45) Date of Patent: Apr. 7, 2026

(54) TRANSFERABLE COMPOSITION AND METHODS FOR PREPARING AND USING THE SAME

(71) Applicant: LUMET TECHNOLOGIES LTD., Rehovot (IL)

(72) Inventors: Benzion Landa, Nes Ziona (IL); Shlomo Levy, Rehovot (IL); Naomi Elfassy, Jerusalem (IL)

(73) Assignee: LUMET TECHNOLOGIES LTD., Rehovot (IL)

( * ) Notice: Subject to any disclaimer, the term of this patent is extended or adjusted under 35 U.S.C. 154(b) by 966 days.

(21) Appl. No.: 17/769,863

(22) PCT Filed: Oct. 22, 2020

(86) PCT No.: PCT/IB2020/059930
§ 371 (c)(1),
(2) Date: Apr. 18, 2022

(87) PCT Pub. No.: WO2021/079308
PCT Pub. Date: Apr. 29, 2021

(65) Prior Publication Data
US 2022/0372259 A1    Nov. 24, 2022

(30) Foreign Application Priority Data
Oct. 22, 2019    (GB) ..................................... 1915300

(51) Int. Cl.
| | |
|---|---|
| *C08K 3/08* | (2006.01) |
| *C08K 3/01* | (2018.01) |
| *C08L 23/0853* | (2025.01) |
| *H05K 1/09* | (2006.01) |

(52) U.S. Cl.
CPC ............ *C08L 23/0853* (2013.01); *C08K 3/01* (2018.01); *C08K 3/08* (2013.01); *H05K 1/092* (2013.01); *C08K 2201/001* (2013.01)

(58) Field of Classification Search
CPC ... C08L 23/0853; C08L 23/0869; C08K 3/01; C08K 3/08; C08K 2201/001; C08K 2003/0806; C08K 2003/0812; H05K 1/092; H10F 77/211; H01B 1/22
See application file for complete search history.

(56) References Cited

U.S. PATENT DOCUMENTS

| | | | |
|---|---|---|---|
| 2016/0225925 A1 * | 8/2016 | Wolfe ...................... | C09D 5/24 |
| 2019/0172967 A1 * | 6/2019 | Landa ................... | H10F 77/311 |

FOREIGN PATENT DOCUMENTS

| | | | |
|---|---|---|---|
| CN | 107418213 | | 12/2017 |
| CN | 108422640 | | 8/2018 |
| CN | 109651754 | | 4/2019 |
| JP | 2010087371 | | 4/2010 |
| WO | 2015116960 | | 8/2015 |
| WO | WO2018/020479 | * | 1/2018 |
| WO | 2018020481 | | 2/2018 |
| WO | 2018020483 | | 2/2018 |

* cited by examiner

*Primary Examiner* — Kumar R Bhushan
(74) *Attorney, Agent, or Firm* — JMB Davis Ben-David

(57) ABSTRACT

There is disclosed a transferable composition being applicable to a membrane serving to transfer a pattern of the composition to an intended substrate. The transferable composition comprises a swellable polymer swelled by a swelling agent and particles dispersed therein. Methods of preparing the composition, applying it to a transfer membrane as a pattern, and transferring the pattern to a substrate, as well as articles made thereby, are also provided. The transferred patterns may serve a decorative and/or functional purpose and the transferable compositions may accordingly include decorative and/or functional particles. When the functional particles are or can be rendered electrically conductive, a pattern formed therewith can be part of a conductive circuit and can serve, for example, for the manufacturing of a solar cell.

17 Claims, 1 Drawing Sheet

TRANSFERABLE COMPOSITION AND METHODS FOR PREPARING AND USING THE SAME

CROSS-REFERENCE TO RELATED APPLICATIONS

This is the US National Stage of International Patent Application No. PCT/IB2020/059930 filed on Oct. 22, 2020, which in turn claims Paris Convention priority from GB patent application No. 1915300.6 filed on Oct. 22, 2019, the contents of which are incorporated by reference in their entirety as if fully set forth herein.

FIELD

The present invention relates to compositions that may be transferred to a substrate for the preparation of a pattern. In particular, the disclosure is concerned with transferable compositions suitable for the preparation of transfer membranes comprising the transferable pattern made of said composition. Methods for preparing and using the compositions and the transfer membranes are also provided.

BACKGROUND

Articles including a pattern on a surface thereof are common in numerous industrial fields. Such patterns may serve a decorative purpose or a functional one. For instance, the substance forming the pattern can include a coloring agent for the former goal, or conductive particles for a latter one wherein the function of the pattern is, by way of example, the formation of an electrical circuit.

While some patterns can directly be applied to the intended product (e.g., by painting a décor), some goods may require a higher precision or uniformity, or may simply be a challenge for direct patterning. For illustration, creating a pattern on a glass window already installed in a building may preferably be done by applying a decal.

When patterns contain electrically conductive particles, they may serve various products and uses, such as PCBs (Printed Circuit Boards), Radio-Frequency Identification (RFID) tags, flip-chip interconnect boards (sometimes known as interposers), printed flexible circuits, touch screens, or solar cells.

Referring to the latter example, solar cells are widely used as means for converting light, generally sunlight energy but also artificial light, into electricity. The solar or photovoltaic cell is typically made of a relatively thin silicon wafer of a few hundred micrometers composed of a number of layers including, for instance, a phosphor-doped n-type layer, upon which photons impinge, and a boron-doped p-type layer. The interface between a n-type layer and a p-type layer, regardless of the dopant used for their formation, is called a p-n junction. A solar cell may include one or more p-n junctions. Electrodes are applied on the opposite sides of the wafer to drive and direct the flow of electrons, the electric current resulting therefrom being wired to an external circuitry. The electrode found on the side of the wafer harvesting the light is often referred to as the front side or front electrode, which is generally formed of a grid-like pattern of relatively narrow conductive lines, also called fingers, spaced from one another to allow sufficient exposure to light, and relatively larger transversal bars, also called bus bars. The pattern can include a variety of conductive materials, generally metals such as silver. The electrode on the other side of the substrate can be referred to as the rear side or back electrode, which generally has a less complex pattern and can even appear as a continuous layer coating an area substantially corresponding to the front electrode. The back electrode need not to be made of the same conductive material as the front electrode and could for instance be made of an aluminum layer. This terminology, which is often used for convenience when referring to mono-facial solar cells, should not be construed as limiting, since there exist bifacial solar cells intending to increase efficiency by collecting light from any direction, by having grid patterns on both sides of the wafer. Moreover, while solid wafers of crystalline silicon (c-Si) still predominate, including the more recent Passivated Emitter and Rear Contact (PERC) solar cells, new types of substrates, for instance thin-film solar cells having a thickness of only several micrometers, are increasingly being used.

Various methods are known for applying electrically conductive patterns to substrates, the selection of which may depend inter alia on the type of pattern, the substrate, and the end-use of the patterned substrate. Generally, the conductive pattern is formed directly on the substrate. In some cases, it is achieved by selective deposition of a conductive material (e.g., in a process similar to printing) and, in others, by coating the entire surface of the substrate with a conductive material, then selectively removing the material, such as by etching or laser ablation, to leave the desired pattern. While the compositions used for the formation of such patterns are often referred to as conductive compositions, they typically acquire this electrical property and provide the desired functionality following one or more additional steps, such as sintering and firing by application of energy thereto. There also exist compositions that are sufficiently conductive for the intended pattern or end-use, without requiring any particular treatment of the pattern following its formation on the substrate. Each of the known methods has its own advantages and disadvantages.

The present Applicant has devised and described in WO 2018/020479, US 2019/0172967, WO 2018/020481 and U.S. Pat. No. 10,645,815 methods of applying to a substrate a pattern of a composition containing particles of an electrically conductive material (e.g., made of metals) in which the pattern from which the conductors are formed is not created directly on the substrate but on a separate transfer membrane or within a pattern of grooves formed therein. The pattern was dried and applied when desired by transfer to an intended substrate (e.g., a solar cell wafer or a PCB insulated board), following which the particles were generally sintered to render the transferred pattern conductive. The Applicant has further detailed in WO 2018/020483 and US 2019/0174635 an apparatus for transferring such patterns of transferable compositions from a surface of the transfer membrane (e.g., a flexible web) to a surface of the substrate, the apparatus advantageously allowing the synchronous application to both sides of the substrate, which in the case of a solar cell may correspond to a front electrode and a back electrode.

While increasing the efficiency of conductive patterns, such as in solar cells, even if only by a few seemingly insignificant percent is a goal common to all, regardless of the manufacturing method (e.g., direct on substrate or indirect on web), this objective is particularly challenging when the conductive compositions which may inter alia contribute to improve such efficiency need to be transferable in addition to having properties which might be desired of compositions used in more conventional methods.

SUMMARY

In a first aspect of the present invention, there is provided a transferable composition adapted for application of a pattern on a transfer membrane and for transfer of the pattern from the transfer membrane to a substrate, the composition comprising:

i) a swellable polymer;
 ii) a swelling agent; and
 iii) a plurality of particles providing a pattern including the composition a decorative and/or functional use;

wherein a) the swelling agent is capable of swelling the swellable polymer so as to form a premix of a swollen polymer; and b) the decorative and/or functional particles (i.e. the particles providing a decorative and/or a functional use to the composition) are dispersed in the polymer premix.

In a second aspect of the present invention, there is provided a transferable composition adapted for application of a pattern on a transfer membrane and for transfer of the pattern from the transfer membrane to a substrate, the composition comprising:

i) a swellable polymer;
 ii) a swelling agent; and
 iii) a plurality of particles providing a pattern including the composition a decorative and/or functional use;

wherein a) the swelling agent is capable of swelling the swellable polymer so as to form a premix of a swollen polymer, the weight of the swelling agent constituting at least 5 wt. %, at least 10 wt. %, at least 15 wt. %, or at least 20 wt. % of the weight of the swellable polymer; and b) the decorative and/or functional particles (i.e. the particles providing a decorative and/or a functional use to the composition) are dispersed in the polymer premix.

In a third aspect of the present invention, there is provided a transferable conductive composition adapted for application of a pattern on a transfer membrane and for transfer of the pattern from the transfer membrane to a substrate, the composition comprising:

i) a swellable polymer;
 ii) a swelling agent; and
 iii) a plurality of electrically conductive particles;

wherein a) the swelling agent is capable of swelling the swellable polymer so as to form a premix of a swollen polymer; and b) the electrically conductive particles are dispersed in the polymer premix.

In a fourth aspect of the present invention, there is provided a transferable conductive composition adapted for application of a pattern on a transfer membrane and for transfer of the pattern from the transfer membrane to a substrate, the composition comprising:

i) a swellable polymer;
 ii) a swelling agent; and
 iii) a plurality of electrically conductive particles;

wherein a) the swelling agent is capable of swelling the swellable polymer so as to form a premix of a swollen polymer, the weight of the swelling agent constituting at least 5 wt. %, at least 10 wt. %, at least 15 wt. %, or at least 20 wt. % of the weight of the swellable polymer; and b) the electrically conductive particles are dispersed in the polymer premix.

In one embodiment, the swellable polymer is contained in the transferable (e.g., conductive) composition in a weight per weight ratio of the swellable polymer (SP) to the swelling agent (SA), SP/SA, fulfilling one or more of the following:

a. SP/SA is at least 1:99, at least 1:49, at least 1:19, at least 1:10, at least 1:6, or at least 1:5;
 b. SP/SA is at most 4:1, at most 2.3:1, at most 1.5:1, at most 1:1, or at most 0.5:1; and
 c. SP/SA is in a range of 1:99 and 9:1, between 1:99 and 4:1, between 1:49 and 2.3:1, between 1:49 and 1.5:1, between 1:19 and 1:1, between 1:10 and 1:1, between 1:10 and 0.5:1, between 1:6 and 0.5:1, or between 1:5 and 0.5:1.

In a particular embodiment, the SP/SA ratio is 1:2.5, 1:3, 1:3.5, 1:4, 1:4.5, 1:5, 1:5.5, or 1:6.

In another embodiment, the swellable polymer fulfills at least one, at least two, or at least three of the following structural properties:

a) the swellable polymer is selected from a group consisting of an amorphous thermoplastic polymer, a semi-crystalline thermoplastic polymer, and a crystalline thermoplastic polymer;
 b) the swellable polymer has a melt flow rate, as measured at 190° C. with a load of 2.16 kg, of at least 0.2 g/10 min, at least 0.3 g/10 min, at least 0.5 g/10 min, at least 1 g/10 min, at least 2 g/10 min, or at least 5 g/10 min;
 c) the swellable polymer has a melt flow rate, as measured at 190° C. with a load of 2.16 kg, of at most 500 g/10 min, at most 250 g/10 min, at most 200 g/10 min, at most 150 g/10 min, at most 100 g/10 min, at most 50 g/10 min, or at most 25 g/10 min;
 d) the swellable polymer has a melt flow rate, as measured at 190° C. with a load of 2.16 kg, within a range of 0.2 g/10 min to 500 g/10 min, 0.2 g/10 min to 250 g/10 min, 0.2 g/10 min to 200 g/10 min, 0.2 g/10 min to 150 g/10 min, 0.2 g/10 min to 100 g/10 min, 0.5 g/10 min to 50 g/10 min, 1 g/10 min to 100 g/10 min, 1 g/10 min to 75 g/10 min, 1 g/10 min to 50 g/10 min, 2 g/10 min to 50 g/10 min, or 2 g/10 min to 25 g/10 min;
 e) the swellable polymer has a melting temperature of at least 50° C., at least 60° C., at least 70° C., or at least 80° C.;
 f) the swellable polymer has a melting temperature of at most 250° C., at most 200° C., at most 150° C., at most 140° C., at most 130° C., at most 120° C., at most 110° C., or at most 100° C.;
 g) the swellable polymer has a melting temperature within a range of 50° C. to 250° C., 60° C. to 200° C., 65° C. to 150° C., 65° C. to 140° C., 65° C. to 130° C., 70° C. to 120° C., or 70° C. to 100° C.;
 h) the swellable polymer has a Vicat softening temperature of at least 30° C., at least 40° C., at least 50° C., or at least 60° C.;
 i) the swellable polymer has a Vicat softening temperature of at most 220° C., at most 180° C., at most 140° C., at most 120° C., at most 100° C., or at most 80° C.; and
 j) the swellable polymer has a Vicat softening temperature within a range of 30° C. to 140° C., 40° C. to 120° C., 50° C. to 100° C., or 50° C. to 90° C.

In one embodiment, the swellable polymer fulfills at least the structural property a) as above listed. In one embodiment, the swellable polymer fulfills at least the structural property b) as above listed. In one embodiment, the swellable polymer fulfills at least the structural property c) as above listed. In one embodiment, the swellable polymer fulfills at least the structural property d) as above listed. In one embodiment, the swellable polymer fulfills at least the structural property e) as above listed. In one embodiment, the swellable polymer fulfills at least the structural property f) as above listed. In one embodiment, the swellable polymer fulfills at least the structural property g) as above listed. In one embodiment, the swellable polymer fulfills at least the structural property h) as above listed. In one embodiment, the swellable polymer fulfills at least the structural property i) as above listed. In one embodiment, the swellable polymer fulfills at least the structural property j) as above listed.

In one embodiment, the swellable polymer fulfills at least the structural properties a), b), c) and d) as above listed. In one embodiment, the swellable polymer fulfills at least the structural properties a), e), f) and g) as above listed. In one embodiment, the swellable polymer fulfills at least the structural properties a), h), i) and j) as above listed. In one embodiment, the swellable polymer fulfills at least the structural properties a), b), e) and h) as above listed. In one embodiment, the swellable polymer fulfills at least the structural properties a), c), f) and i) as above listed. In one embodiment, the swellable polymer fulfills at least the structural properties a), d), g) and j) as above listed.

In one embodiment, the swellable polymer contained in the transferable (e.g., conductive) composition of the present invention fulfills in addition to the at least one, at least two, at least three of the structural properties listed in a) to j), one or more of the following interactive properties with respect to the additional constituents of the composition:

k) the swellable polymer is not miscible within the swelling agent;

l) no more than 10 wt. %, no more than 5 wt. %, no more than 2 wt. %, or no more than 1 wt. % of the swellable polymer can be dissolved in the swelling agent by weight of the swelling agent.

In yet another embodiment, the swellable polymer contained within the transferable (e.g., conductive) composition is a thermoplastic polymer selected from a group consisting of ethylene/vinyl acetate (EVA) co-polymer, acid modified ethylene acrylate resin, ethylene/acrylic ester/maleic anhydride ter-polymer, polyvinyl butyral, polyvinyl alcohol and polyamide.

In one embodiment, the swellable polymer is present in the composition at a volume concentration by volume of all solids of at least 1 vol. %, at least 2 vol. %, at least 5 vol. %, or at least 10 vol. %. In another embodiment, the swellable polymer is present in the composition at a volume concentration by volume of all solids of at most 25 vol. %, at most 22 vol. %, or at most 20 vol. %. In yet another embodiment, the swellable polymer is present in the composition within a range of 2 vol. % to 25 vol. %, 5 vol. % to 25 vol. %, or 10 vol. % to 22 vol. % by volume of all solids of the composition.

In one embodiment, the swelling agent contained in the transferable (e.g., conductive) composition of the present invention fulfills at least one, at least two, or at least three of the following structural properties:

A) the swelling agent is an aqueous solvent containing at least 75 wt. %, at least 80 wt. %, at least 85 wt. %, at least 90 wt. %, or at least 95 wt. % of water;

B) the swelling agent is an organic solvent containing at most 25 wt. %, at most 20 wt. %, at most 15 wt. %, at most 10 wt. %, or at most 5 wt. % of water;

C) the swelling agent contains at most 1.0 wt. %, at most 0.5 wt. %, at most 0.1 wt. %, at most 0.05 wt. % or at most 0.01 wt. % of water;

D) the swelling agent has a boiling temperature of at least 90° C., at least 100° C., at least 110° C., at least 120° C., at least 130° C., at least 140° C., at least 150° C., or at least 160° C.;

E) the swelling agent has a boiling temperature of at most 450° C., at most 400° C., at most 350° C., at most 300° C., at most 290° C., at most 280° C., at most 270° C., at most 260° C., or at most 250° C.;

F) the swelling agent has a boiling temperature within the range of 90° C. to 450° C., 100° C. to 450° C., 100° C. to 400° C., 100° C. to 350° C., 100° C. to 300° C., 105° C. to 290° C., 110° C. to 280° C., 115° C. to 270° C., 120° C. to 300° C., 120° C. to 250° C., 130° C. to 400° C., 160° C. to 350° C., 150° C. to 300° C., or 150° C. to 250° C.;

G) the swelling agent has a vapor pressure of at least $10^{-6}$ kPa, at least $10^{-5}$ kPa, at least $10^{-4}$ kPa, at least $5*10^{-4}$ kPa, or at least $10^{-3}$ kPa (as measured by standard methods circa room temperature between 20° C. and 25° C.);

H) the swelling agent has a vapor pressure of at most 5 kPa, at most 4 kPa, at most 3 kPa, at most 2 kPa, at most 1 kPa, at most 0.5 kPa, at most $10^1$ kPa, at most $5*10^{-2}$ kPa, or at most $10^{-2}$ kPa (as measured by standard methods circa room temperature between 20° C. and 25° C.);

I) the swelling agent has a vapor pressure within the range of $10^{-6}$ kPa to 5 kPa, $10^{-5}$ kPa to 4 kPa, $10^{-4}$ kPa to 3 kPa, $10^{-3}$ kPa to 2.5 kPa, $10^{-6}$ kPa to 0.5 kPa, $10^{-6}$ kPa to $10^{-1}$ kPa, or $10^{-6}$ kPa to $10^{-2}$ kPa (as measured by standard methods circa room temperature between 20° C. and 25° C.); and J) the swelling agent has a viscosity of at least 1 mPa s and optionally at most 1,000 mPa s, at most 500 mPa s, at most 250 mPa s, or at most 150 mPa s (as measured by standard methods circa room temperature between 20° C. and 25° C.).

In one embodiment, the swelling agent contained in the transferable (e.g., conductive) composition of the present invention fulfills in addition to at least one, at least two, or at least three of the structural properties listed in A) to J), one or more of the following interactive properties with respect to the additional constituents of the composition:

K) the swelling agent is chemically inert with respect to the (e.g., electrically conductive) particles;

L) the swelling agent is not miscible with the swellable polymer;

M) the swelling agent can dissolve no more than 10 wt. % of the swellable polymer, no more than 5 wt. %, no more than 2 wt. %, or no more than 1 wt. %, by weight of the swellable polymer.

In one embodiment, the swelling agent fulfills at least the structural property A) as above listed. In one embodiment, the swelling agent fulfills at least the structural property B) as above listed. In one embodiment, the swelling agent fulfills at least the structural property C) as above listed. In one embodiment, the swelling agent fulfills at least the structural property D) as above listed. In one embodiment, the swelling agent fulfills at least the structural property E) as above listed. In one embodiment, the swelling agent fulfills at least the structural property F) as above listed. In one embodiment, the swelling agent fulfills at least the structural property G) as above listed. In one embodiment, the swelling agent fulfills at least the structural property H) as above listed. In one embodiment, the swelling agent fulfills at least the structural property I) as above listed. In one embodiment, the swelling agent fulfills at least the structural property J) as above listed. In one embodiment, the swelling agent fulfills at least the interactive property K) as above listed. In one embodiment, the swelling agent fulfills at least the interactive property L) as above listed. In one embodiment, the swelling agent fulfills at least the interactive property M) as above listed.

In one embodiment, the swelling agent fulfills at least the structural properties D), I) and J) as above listed. In one embodiment, the swelling agent fulfills at least the structural properties E), I) and J) as above listed. In one embodiment, the swelling agent fulfills at least the structural properties F), G) and J) as above listed. In one embodiment, the swelling agent fulfills at least the structural properties F), H) and J) as above listed. In one embodiment, the swelling agent fulfills at least the structural properties A), F), I) and J) as above listed. In one embodiment, the swelling agent fulfills at least the structural properties B), F), I) and J) as above listed. In one embodiment, the swelling agent fulfills at least the structural properties C), F), I) and J) as above listed.

In one embodiment, the swelling agent fulfills at least the interactive properties K) and L) as above listed. In one embodiment, the swelling agent fulfills at least the interactive properties K) and M) as above listed. In one embodiment, the swelling agent fulfills at least the interactive properties L) and M) as above listed. The foregoing interactive properties of the swelling agent (or blend thereof) are in some embodiments in addition to the structural properties or combinations thereof of the swelling agent(s), as previously detailed.

In another embodiment, the swelling agent is selected from a group consisting of $C_{6-20}$ isoparaffins, $C_{3-10}$ ketones, $C_{1-12}$ alcohols, $C_{6-10}$ aromatic hydrocarbons, glycerin, water and combinations thereof.

In one embodiment, the particles contained in the transferable composition are or include colorants, their presence enabling the preparation of decorative patterns and/or facilitating the visualization of functional patterns. The colorants may be selected from natural or synthetic, organic or inorganic, pigments and dyes, or from any other substance capable of imparting a color or any other detectable visual effect (e.g., pearlescent, glittering, fluorescent, etc.) and of combinations thereof.

Such coloring agents are known and need not be detailed herein. For brief illustration, an organic pigment can be selected from a group comprising perylene pigments; phthalocyanine pigments; quinacridone pigments; and imidazolone pigments. Inorganic pigments can include, for example, titanium dioxide, cadmium sulfoselenide, iron oxide, bismuth vanadate, cobalt titanate, sodium aluminosulfosilicate, mixed Fe—Mg—Ti oxides, manganese ferrite, and metallic or alloy pigments.

In one embodiment, the electrically conductive particles contained in the transferable conductive composition include or consist of metals, alloys, organo-metals, or oxides, precursors, hydrates and/or salts thereof; or of conductive polymers. Particles that may provide a functional role to the pattern (e.g., electrical conductivity) may additionally or alternatively provide a decorative effect and may accordingly be used for the preparation of transferable composition other than electrically conductive.

In one embodiment, the electrically conductive particles can include the aforesaid materials by having a core made of a different substance, such core being further coated by an electrically conductive material. By way of example, solid or hollow glass, ceramic or plastic microspheres (e.g., made of barium titanate, silica, or polymethyl methacrylate) can be at least partially coated with a metal (e.g., aluminum, silver, gold, nickel etc.) to form electrically conductive particles.

In another embodiment, the electrically conductive particles (whether formed of an electrically conductive material or of different substance at least partially coated with such a material) are present in the composition at a volume concentration by volume of all solids of at least 65 vol. %, at least 70 vol. %, or at least 75 vol. %. In one embodiment, the electrically conductive particles are present in the composition at a volume concentration by volume of all solids of at most 98 vol. %, at most 95 vol. %, or at most 90 vol. %. In yet another embodiment, the electrically conductive particles are present in the composition in a range from 65 vol. % to 98 vol. %, from 70 vol. % to 95 vol. %, or from 75 vol. % to 90 vol. % by volume of all solids of the composition.

In one embodiment, the transferable (e.g., conductive) composition further comprises glass frits. In another embodiment, the glass frits are present in the composition in an amount within a range of 0.1 to 15 vol. %, 0.2 to 12.5 vol %., 0.2 to 12.5 vol %., 0.5 to 10 vol. %, 0.5 to 8 vol. %, 0.5 to 6 vol. %, 0.5 to 5 vol. % or 1 to 5 vol. % by volume of the electrically conductive particles.

Glass frits suitable for such transferable compositions comprise silica and one or more compounds selected from the group comprising: lead oxide, zinc oxide, boron oxide, bismuth oxide, strontium oxide, aluminum oxide, tellurium oxide, vanadium pentoxide, barium oxide, magnesium oxide, molybdenum oxide, molybdenum trioxide, phosphorus pentoxide, tin oxide and tungsten oxide.

In one embodiment, the transferable (e.g., conductive) composition further comprises one or more rheological modifiers. In another embodiment, the one or more rheological modifiers are present in the composition in a total amount of 0.05 wt. % to 20 wt. %, 0.1 wt. % to 15 wt. %, 0.1 wt. % to 10 wt. %, 0.5 wt. % to 5 wt. %, or 1 wt. % to 4 wt. % by weight of the total composition. In yet another embodiment, the rheological modifier is selected from a group consisting of: dibutyl sebacate, butyl stearate, glycol esters of coconut oil fatty acids, butyl ricinoleate, dibutyl phthalate, castor oil, hydrogenated castor oil, hydrogenated microcrystalline wax, hydrogenated resin, hydrocarbon resin, paraffin wax, beeswax, cetyl alcohol, butyl stearate, diethyl phthalate, diphenyl phthalate, dicyclohexyl phthalate, 2-butoxy-2-oxoethyl butyl phthalate, and dioctyl phthalate.

In one embodiment, the transferable (e.g., conductive) composition further comprises one or more dispersing agents. In another embodiment, the one or more dispersing agents are present in a total amount of 0.05 wt. % to 20 wt. %, 0.1 wt. % to 15 wt. %, 0.1 wt. % to 10 wt. %, 0.5 wt. % to 5 wt. %, or 1 wt. % to 4 wt. % by weight of the total composition. In yet another embodiment, the dispersing agent is selected from a group consisting of: ether/ester dispersants including complex mixtures of esters of phosphoric acid and polyethylene glycol ethers of oleyl alcohol; complex mixtures of esters of phosphoric acid and the polyoxypropylene; polyoxyethylene ether of cetyl alcohol; complex mixtures of esters of phosphoric acid and polyethylene glycol ether of tridecyl alcohol; complex mixtures of esters of phosphoric acid and an ester of isotridecyl ethylene glycol; and anionic dispersants.

In one embodiment, the transferable (e.g., conductive) composition, comprising a swellable polymer, a swelling agent and particles providing a pattern including the composition a decorative and/or functional use, fulfills at least one of:

i) the swellable polymer is an EVA co-polymer, having a weight by weight content of vinyl acetate of at least 10 wt. %, at least 15 wt. %, or at least 20 wt. %, and optionally at most 40 wt. % or at most 30 wt. %;

ii) the swelling agent is an isoparaffin having a carbon chain length of 10 to 19 carbon atoms; and iii) the particles include or consist of a metal, the transferable composition being optionally electrically conductive.

In one embodiment, when the application of the composition to the intended surface (such as a substrate or a transfer membrane allowing transfer to a substrate) involves applying shear, such as in screen printing processes, the transferable composition preferably has a shear thinning behavior, wherein at a shear rate of at least 150 s⁻¹ and at a temperature of about 80° C., the composition viscosity decreases by at least one order of magnitude.

In a particular embodiment, the transferable conductive composition is adapted for application of a pattern on a transfer membrane and for transfer of the pattern from the transfer membrane to a substrate adapted for the manufacturing of a solar cell. In such case, the transferable conductive composition is more concisely said to be adapted to the manufacturing of a solar cell. In such an embodiment, the "transferability" of the composition relates to its ability to transfer from the transfer membrane to the substrate, this transferability creating demanding challenges on the composition, not typically tackled by conventional compositions being directly applied to their intended substrate. On the contrary, conventional compositions typically seek to be non-transferable once applied.

In a preferred embodiment, when separation of the membrane from the substrate is sought, the transferable composition substantially fully transfers from the transfer membrane to the substrate, leaving essentially no residues of the composition on the transfer membrane (e.g., less than 5 wt. %, by weight of the composition applied on the membrane, or less than 4 wt. %, less than 3 wt. %, less than 2 wt. %, less than 1 wt. %, less than 0.5 wt. %, or less than 0.1 wt. %). This embodiment has the advantage of allowing the formation of a desired transferable pattern on the transfer membrane, as the pattern is essentially fully transferred to the substrate.

As used herein the "transferability" of a transferable composition adapted for application of a pattern on a substrate, and particularly adapted for application of a pattern on a transfer membrane and for transfer of the pattern from the transfer membrane to a substrate, encompasses both the preferred adherence of the pattern to the substrate, prior to an optional separation between a transfer membrane and the substrate, as well as the full transfer to the substrate (following separation from the membrane and "full release" therefrom).

In another aspect of the present invention, there is provided a method for preparing a transferable composition, the method comprising:

a) providing a polymer premix containing a swellable polymer swelled with a swelling agent; the polymer premix being at a temperature greater than a softening temperature of the swellable polymer;
mixing the polymer premix of step a) with decorative or functional particles at a temperature of at least 50° C., at least 60° C., at least 70° C., or at least 80° C. and optionally at most 250° C., at most 200° C., at most 150° C., or at most 100° C., to disperse the particles within the polymer premix so as to obtain the transferable composition.

In yet another aspect of the present invention, there is provided a method for preparing a transferable conductive composition, the method comprising:

a) providing a polymer premix containing a swellable polymer swelled with a swelling agent; the polymer premix being at a temperature greater than a softening temperature of the swellable polymer;

b) mixing the polymer premix of step a) with electrically conductive particles at a temperature of at least 50° C., at least 60° C., at least 70° C., or at least 80° C. and optionally at most 250° C., at most 200° C., at most 150° C., or at most 100° C., to disperse the electrically conductive particles within the polymer premix so as to obtain the transferable conductive composition.

In one embodiment, the polymer premix of step a) is prepared by combining the swellable polymer with the swelling agent to obtain a mixture, and heating said mixture until complete melting of the swellable polymer. In another embodiment, the heating temperature is higher by at least 20° C., at least 40° C., or at least 60° C. than the polymer melting point, and optionally at least lower by 40° C., at least 60° C., or at least 80° C. than the swelling agent boiling point.

In one embodiment, the swellable polymer, the swelling agent, the particles and the transferable (e.g., conductive) composition prepared therefrom are according to the teachings herein detailed, including the previously disclosed embodiments, in which case the methods, or steps thereof, can be adapted accordingly.

By way of example, in one embodiment, the method for preparing a transferable composition or a conductive transferable composition, further includes adding glass frits either during step a) to the premix, or during step b) with the decorative or functional particles (e.g., electrically conductive ones), or both.

In a particular embodiment, the transferable conductive composition prepared by the method briefly described above and further detailed herein is a composition adapted for application of a pattern on a transfer membrane and for transfer of the pattern from the transfer membrane to a substrate adapted for the manufacturing of a solar cell. In such case, the method for preparing the transferable conductive composition is more concisely said to be adapted to the manufacturing of a solar cell.

In a further aspect of the present invention, there is provided a method of manufacturing a transfer membrane suitable for applying a decorative or functional pattern to a substrate, the method comprising:

a) applying with an applicator a transferable composition comprising (i) a swellable polymer swelled with a swelling agent and (ii) decorative or functional particles onto a transfer membrane, the transferable composition being applied at an application temperature sufficiently elevated for the composition to be flowable enough for the applicator;

b) optionally heating the transfer membrane to a temperature within at most 20° C. from the application temperature of the transferable composition prior to and/or during application of the transferable conductive composition;

c) optionally eliminating excess of the transferable composition from the surface of the transfer membrane, so as to leave thereon the pattern;

d) optionally eliminating at least part, but not all, of the swelling agent from the pattern; and e) reducing the temperature of the transfer membrane or allowing the temperature of the transfer membrane to decrease, so that the pattern of the transferable composition applied thereto is sufficiently attached to the membrane.

In yet another aspect of the present invention, there is provided a method of manufacturing a transfer membrane suitable for applying a pattern (e.g., of electrical conductors) to a substrate, the method comprising:

a) applying with an applicator a transferable conductive composition comprising a swellable polymer swelled with a swelling agent and (e.g., electrically conductive) particles onto a transfer membrane, the transferable (e.g., conductive) composition being applied at an application temperature sufficiently elevated for the composition to be flowable enough for the applicator;

b) optionally heating the transfer membrane (e.g., to a temperature within at most 20° C. from the application temperature of the transferable composition) prior to and/or during application of the transferable conductive composition;

c) optionally eliminating excess of the transferable composition from the surface of the transfer membrane, so as to leave thereon the pattern;

d) optionally eliminating at least part, but not all, of the swelling agent from the pattern; and e) reducing the temperature of the transfer membrane or allowing the temperature of the transfer membrane to decrease, so that the pattern of the transferable conductive composition applied thereto is sufficiently attached to the membrane.

In some embodiments, the transferable composition applied in step a) for the manufacturing of the transfer membrane, further comprises glass frits.

In one embodiment, the pattern is formed upon the surface of the transfer membrane. In another embodiment, the pattern is formed within grooves below the surface of the transfer membrane. In yet another embodiment, the pattern can be formed in part within grooves, and in part upon the surface of the transfer membrane. By way of example, a grid like conductive pattern can have its lines of conductors (e.g., solar cells' fingers) formed within grooves, and other components (e.g., solar cells' bus bars or PCB solder bump) formed thereafter on the surface.

In a particular embodiment, when the pattern is formed at least in part within grooves below the surface of the transfer membrane, the transferable composition or the transferable conductive composition can be loaded within said grooves in a number of loading cycles. Grooves can be formed in the surface of the transfer membrane by any suitable mean (e.g., with a die or a laser).

As similar principles apply regardless of the type of particles included in the transferable composition, in the following, and unless otherwise clear from context, reference to a transferable (conductive) composition refers to a transferable composition including decorative particles, functional particles, or electrically conductive particles (the conductivity of the particles being either intrinsic or acquired following a suitable treatment of a pattern made therefrom, e.g., by sintering). Thus, the term "transferable (conductive) composition" includes "transferable composition" and "transferable conductive composition", as previously briefly defined and further detailed hereinafter. Similarly, the terms "(conductive) particles" or "(electrically conductive) particles" can be used to refer to decorative particles, functional particles, or electrically conductive particles.

In one embodiment, when the transferable composition is applied to the surface of the membrane or in grooves therein in a number of loading cycles, the portion of the pattern being applied and at least partially dried at each cycle is made of a same transferable (conductive) composition. In such case, and in the event that the portion of a subsequently applied pattern additionally coincides in shape, dimension and position with the portion of a subsequently applied pattern, the portions of the pattern being applied at each cycle can be viewed as similar layers of a same final pattern. Alternatively, even in the case a same transferable (conductive) composition is used for each cycle, the portions of patterns may differ from cycle to cycle and not necessarily overlap in part or in whole. In such an embodiment, the portions of the pattern being applied at each cycle can be viewed as segments of a same final pattern.

In an alternative embodiment, the portion of the pattern being applied and at least partially dried at each cycle is made of a transferable (conductive) composition differing between at least two cycles. As in the above-described situation, the portions of the pattern may substantially entirely overlap, in which case at least two cycles may be viewed as forming a different layer of the pattern, or the portions of the pattern applied at each cycle may also differ at least in positioning, in which case cycles may be viewed as forming different segments of the pattern. Differences between transferable compositions can, for instance, relate to the identity of its constituents and to the relative proportions between the constituents.

In one embodiment, the flexible web includes grooves corresponding, at least in part, to the desired pattern and the transferable (conductive) composition is applied by filling the grooves.

In another embodiment, the transfer membrane is flexible, and optionally consists of a thermoplastic polymer, selected from a group consisting of cyclic olefin copolymer (COC), polyvinylchloride (PVC); polyethylene (PE), polypropylene (PP), thermoplastic polyurethane (TPU), polyethylene terephthalate (PET), and combinations thereof. In yet another embodiment, the transfer membrane is pretreated prior to the application of the transferable composition, said pretreatment facilitating one or more of i) an attachment of the pattern to the membrane, and ii) a transfer of the pattern to the substrate upon contacting of the transfer membrane with the substrate.

In another embodiment, the transfer membrane is a flexible foil made of plastic, metal, paper, or laminated combination thereof, and the flexible foil is impermeable to the transferable conductive composition for the pattern to remain upon the surface of the membrane. In yet another embodiment, the transfer membrane is further coated by an impermeabilizing agent.

In yet another embodiment, the transferable (conductive) composition applied onto the transfer membrane is a transferable (conductive) composition according to the teachings herein detailed, including the embodiments previously briefly described, and prepared by a method according to the teachings herein detailed, including the embodiments previously briefly described.

In a particular embodiment, the substrate upon which the pattern can be transferred from the transfer membrane is adapted for the manufacturing of a solar cell. In such case, when the substrate is a surface of a solar cell, the method for manufacturing a transfer membrane suitable for applying a pattern of a transferable conductive composition is more concisely said to be adapted to the manufacturing of a solar cell.

In another aspect of the present invention, there is provided a transfer membrane suitable for applying a decorative or functional pattern to a substrate, the transfer membrane having on a surface and/or within grooves thereof a pattern made of or consisting of a transferable composition, the composition including a swellable polymer swelled with a swelling agent and decorative or functional particles respectively; the transfer membrane being such that upon pressing the membrane and the substrate against one another, the transferable composition adheres more strongly to the substrate than to the transfer membrane, and such that subsequent separation of the transfer membrane from the substrate, if desired, results in the transferable composition remaining on the substrate as a pattern.

In another aspect of the present invention, there is provided a transfer membrane suitable for applying a pattern of electrical conductors to a substrate, the transfer membrane having on a surface and/or within grooves thereof a pattern made of or consisting of a transferable conductive composition, the composition including a swellable polymer swelled with a swelling agent and electrically conductive particles, the composition optionally being adapted to become electrically conductive upon sintering by application of energy thereto; the transfer membrane being such that upon pressing the membrane and the substrate against one another, the transferable conductive composition adheres more strongly to the substrate than to the transfer membrane, and such that subsequent separation of the transfer membrane from the substrate, if desired, results in the transferable conductive composition remaining on the substrate as a pattern.

In one embodiment, the transfer membrane suitable for applying a pattern (e.g., of electrical conductors) to a substrate is prepared according to the teachings herein detailed, including by the method previously briefly described.

In a particular embodiment, the substrate upon which the transfer membrane can transfer a pattern adapted to become electrically conductive is formed by a surface of a solar cell. In such case, the transfer membrane can be concisely said to be adapted for the manufacturing of a solar cell.

In another aspect of the present invention, there is provided a method of applying a decorative or functional pattern to a substrate, the method comprising:

a) providing a flexible transfer membrane, wherein a first surface of the transfer membrane has a transferable pattern of a transferable composition formed thereon and/or within grooves therein, the transferable composition comprising a swellable polymer swelled by a swelling agent and decorative or functional particles, and the transferable pattern corresponding at least partially to a desired pattern to be applied to the substrate;

b) contacting the transfer membrane with the substrate, with the first surface of the membrane facing the substrate, said contacting being optionally at a transfer temperature greater than 60° C.; and d) applying pressure to the transfer membrane to cause the transferable pattern of transferable composition to adhere to the substrate, said pressure optionally being of at least 0.1 kgF/cm² and at most 50 kgF/cm².

In some embodiments, the method of applying a decorative or functional pattern to a substrate further comprises:

e) separating the transfer membrane from the substrate to transfer the transferable pattern from the first surface of the membrane or from grooves therein to the substrate, said separating being optionally at a separating temperature lower than a temperature of transfer; and/or f) optionally post-treating the pattern of composition transferred to the substrate.

The separation of the transfer membrane from the substrate need not be performed within a short time from the application of pressure causing the adhesion of the transferable pattern of transferable composition to the substrate. In some embodiments, the transfer membrane may be permanently retained as a protective layer to the transferred pattern, in which case the transfer membrane may optionally be adapted to permit a post-treatment of the transferred pattern, or the transfer membrane may be separated close to a time at which the transferred pattern would be post-treated or used.

In yet another aspect of the present invention, there is provided a method of applying a pattern of electrical conductors to a substrate, which method comprises:

a) providing a flexible transfer membrane, wherein a first surface of the transfer membrane has a transferable pattern of a transferable conductive composition formed thereon and/or within grooves therein, the transferable conductive composition comprising a swellable polymer swelled by a swelling agent and electrically conductive particles, and the transferable pattern corresponding at least partially to a desired pattern of electrical conductors to be applied to the substrate;

b) contacting the transfer membrane with the substrate, with the first surface of the membrane facing the substrate, said contacting being optionally at a transfer temperature greater than 60° C.; and d) applying pressure to the transfer membrane to cause the transferable pattern of transferable conductive composition to adhere to the substrate, said pressure optionally being of at least 0.1 kgF/cm² and at most 50 kgF/cm².

In some embodiments, the method of applying a pattern of electrical conductors to a substrate further comprises:

e) separating the transfer membrane from the substrate to transfer the transferable pattern from the first surface of the membrane or from grooves therein to the substrate, said separating being optionally at a separating temperature lower than a temperature of transfer; and f) optionally applying sufficient energy to sinter the electrically conductive particles and to render electrically conductive the pattern of composition transferred to the substrate.

In one embodiment, the method of applying a pattern of electrical conductors to a substrate formed by a surface of a solar cell further fulfills at least one of the following:

i) the swelling agent is present in the transferable conductive composition at a volume concentration of at least 10 vol. % by volume of the transferable composition;

ii) the swelling agent is present in the transferable conductive composition at a weight concentration of at least 10 wt. % by weight of the transferable composition;

iii) the swellable polymer has melting temperature in a range of 50° C. to 250° C., 60° C. to 200° C., 65° C. to 150° C., 65° C. to 140° C., 65° C. to 130° C., 70° C. to 120° C., or 70° C. to 100° C.;

iv) the swelling agent has a boiling temperature in a range of 90° C. to 450° C., 100° C. to 450° C., 100° C. to 400° C., 100° C. to 350° C., 100° C. to 300° C., 105° C. to 290° C., 110° C. to 280° C., 115° C. to 270° C., 120° C. to 300° C., 120° C. to 250° C., 130° C. to 400° C., 160° C. to 350° C., 150° C. to 300° C., or 150° C. to 250° C.; and v) the swelling agent has a vapor pressure in a range of $10^{-6}$ kPa to 5 kPa, $10^{-5}$ kPa to 4 kPa, $10^{-4}$ kPa to 3 kPa, $10^{-3}$ kPa to 2.5 kPa, $10^{-6}$ kPa to 0.5 kPa, $10^{-6}$ kPa to $10^{-1}$ kPa, or $10^{-6}$ kPa to $10^{-2}$ kPa.

vi) the transfer membrane is heated prior to contacting the substrate;

vii) the substrate is heated prior to contacting the transfer membrane;

viii) contacting is performed at a transfer temperature of at least 60° C., at least 70° C., or at least 80° C.;

ix) contacting is performed at a transfer temperature of at most 250° C., at most 200° C., or at most 180° C.; and x) separating, if and when performed, is performed at a
separating temperature at least 5° C., at least 10° C., at
least 20° C., or at least 30° C. lower than a temperature
of transfer.

In a particular embodiment, the substrate to which the
flexible transfer membrane is applied includes a surface of
a solar cell.

In another aspect of the present invention, there is pro-
vided a use of a transferable composition according to the
teachings of the present invention including inter alia a
swelled polymer, for the manufacture of a pattern on a
substrate. In one embodiment, the transferable composition
includes decorative particles and the transferred pattern is
decorative. In another embodiment, the transferable compo-
sition includes functional particles and the transferred pat-
tern is functional. In a particular embodiment, the functional
particles are electrically conductive particles capable of
forming an electrically conductive pattern optionally fol-
lowing application of energy sufficient to sinter the electri-
cally conductive particles contained in the composition, the
electrically conductive pattern adapted to form a back-
electrode or a front electrode on a surface of a solar cell.

Additional objects, features and advantages of the disclo-
sure will be set forth in the detailed description which
follows, and in part will be readily apparent to those skilled
in the art from the description or recognized by practicing
the disclosure as described in the written description and
claims hereof. Various features and sub-combinations of
embodiments of the disclosure may be employed without
reference to other features and sub-combinations.

BRIEF DESCRIPTION OF THE DRAWINGS

Some embodiments of the disclosure will now be
described further, by way of example, with reference to the
accompanying figures, where like reference numerals or
characters indicate corresponding or like objects. The
description, together with the figures, makes apparent to a
person having ordinary skill in the art how some embodi-
ments of the disclosure may be practiced. The figures are for
the purpose of illustrative discussion and no attempt is made
to show structural details of an embodiment in more detail
than is necessary for a fundamental understanding of the
disclosure. For the sake of clarity and convenience of
presentation, some objects depicted in the figures are not
necessarily shown to scale.

In FIG. 1, which schematically depicts a method of
preparing a transferable composition according to some
embodiments of the invention:

DETAILED DESCRIPTION

Figures 1A, 1B, 1C:
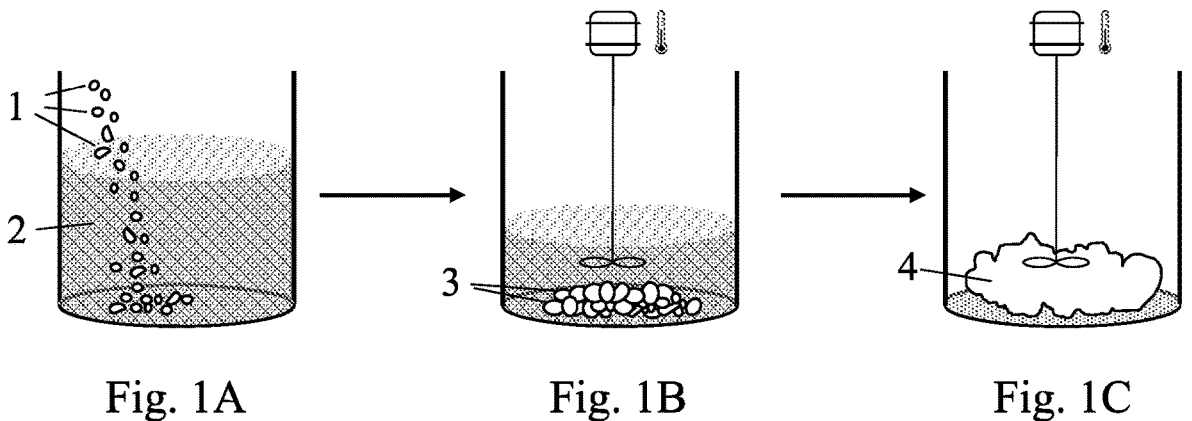
FIG. 1A illustrates the addition of a swellable polymer
into a swelling agent.
FIG. 1B illustrates the gradual swelling of the swellable
polymer.
FIG. 1C illustrates a polymer premix obtained following
swelling of the polymer by the swelling agent.

The present disclosure relates to transferable composi-
tions. Methods of preparing and using the same are also
described.

Transferable conductive compositions have been previ-
ously described by the present Applicant. These prior com-
positions, termed metal pastes in WO 2018/020479 and WO
2018/020481, were based inter alia on polymers generally
known as binders and used in transfer once substantially
dried (e.g., containing less than 5 vol. % of a liquid). Briefly
put, and without getting into the details of the foregoing
publications, the previously disclosed polymers served,
alone or in combination with additional ingredients, the
following goals within the transferable composition: first
maintaining the conductive particles mixed therewith in the
shape desired for the pattern formed upon or within a
transfer membrane (e.g., a flexible web), secondly allowing
transfer of the patterns from the transfer membrane to the
intended substrate substantially in their entirety (i.e. detach-
ing/releasing from the membrane and attaching the compo-
sition to the substrate (e.g., a solar wafer or an insulating
substrate), and finally maintaining the pattern transferred in
its intended shape sufficiently adhered to the substrate for
following steps, such as sintering and firing, to be subse-
quently optionally performed, or more simply for handling
and/or storage of the transfer membrane during or prior to its
use.

To fulfill such goals, a binder polymer would typically be
present in the composition being transferred in relatively
high amounts (e.g., of more than 30 vol. % per volume of
solids, or even more than 40 vol. %), which may in turn
result in relatively high level of residues of burnt polymers
in the sintered and/or fired patterns. Without wishing to be
bound by any particular theory, it is assumed that such
residues may affect the electrical efficacy of the pattern. For
instance, excess of burnt polymer residues may decrease the
performance of a solar cell by lowering its open-circuit
voltage ($V_{OC}$) which is the voltage generated by a solar cell
at zero current, said voltage is typically measured in milli-
volt (mV) under standard testing conditions (e.g. at a tem-
perature of 25° C. and a perpendicular illumination of 1,000
Watt/square meters). A person skilled in the art of solar cell
manufacturing can readily appreciate that a relatively high
$V_{OC}$ is only one of the parameters indicatives of a satisfac-
torily operational solar cell (and of solar modules or panels
made therefrom). The short circuit current density ($J_{SC}$), the
fill factor (FF), and the efficiency ($\eta$) of a cell are additional
parameters often used to assess potency of an end-product.
These parameters can be further related to additional char-
acteristics of a solar cell and, for instance, a relatively high
$V_{OC}$ may require a relatively low reverse saturation current
density, $J_0$, which is a measure of recombination in the solar
cell.

Therefore, it would be advantageous to lower the amounts
of polymers needed for a transferable composition to pre-
vent or reduce any deleterious effect their presence, or
presence of residues therefrom, may have on the subsequent
efficacy of the conductive pattern, as exemplified for a solar
cell. The present Inventors have discovered that swellable
polymers, when used swelled during transfer, may address
this problem, namely improving the efficacy of a solar cell,
while fulfilling the goals listed above for non-swelled or
non-swellable polymers.

While the present invention will be described in more
details in the context of solar cells manufacturing, the skilled
person can readily appreciate that the present teachings can
similarly be applied to the preparation of conductive patterns
for a variety of "non-solar" products. Moreover, the pattern
need not be an electrically conductive one, and transferable patterns containing particles providing for a different function or for a mere ornamental purpose can also be prepared according to the disclosure.

The use of polymers being swelled by a swelling agent allows applying a lower amount of the swellable polymer, as compared to a non-swellable or non-swelled one, for a same volume of transferable paste as previously designed to achieve a desired pattern. Suitable swellable polymers may not only permit lowering the relative amount of the polymer in the composition, but also provide rheological properties suitable for the workability of the composition, in particular its application to the transfer membrane and its transferability therefrom to a suitable substrate (typically while at least part, but not all, of the swelling agent is already eliminated, for instance by evaporation). While being in a relatively lower amount than a non-swellable polymer, a suitable swellable polymer should still be able to provide the desired mechanical properties to the pattern and satisfactory transferability.

Before explaining at least one embodiment in detail, it is to be understood that the disclosure is not necessarily limited in its application to the details of construction and the arrangement of the components and/or methods set forth herein. The disclosure is capable of other embodiments or of being practiced or carried out in various ways. The phraseology and terminology employed herein are for descriptive purpose and should not be regarded as limiting.

It is to be understood that both the foregoing general description and the following detailed description, including the materials, methods and examples, are merely exemplary of the disclosure, and are intended to provide an overview or framework to understanding the nature and character of the disclosure as it is claimed, and are not intended to be necessarily limiting.

Transferable Composition

The transferable compositions of the present invention can be used inter alia to produce conductive patterns for the manufacturing of solar cells. Briefly, the composition is prepared, then applied onto a transfer membrane to form the pattern, which can subsequently be transferred to a solar wafer substrate, while the swellable polymer is still swelled to some extent (to be later detailed). Following transfer, the pattern, now attached to the wafer, can be, if necessary, sintered and/or fired to render the pattern conductive, or otherwise treated to reduce or eliminate the presence of the constituents having conferred transferability (e.g., the swellable polymer and the swelling agent) to the extent no longer required (or even deleterious) for the intended use. For brevity, the transferable composition is said to be applicable or applied to or onto a transfer membrane regardless of the position of the composition upon the surface of the membrane or within grooves formed therein. Prior to transfer, the pattern of transferable composition can also be referred to as the transferable pattern.

The foregoing steps need not all be performed at the same location, nor necessarily in immediate time sequence, nor by the same entities. For instance, the manufacturing of the transfer membrane (e.g., a flexible web) may be done at a first location by a first entity, the preparation of the transferable compositions and their application onto or within the membrane so as to prepare transferable patterns can be done at a second location by a second entity (e.g., by roll-to-roll manufacturing of a disposable membrane including the transferable patterns), and transfer of the patterns from the membrane to the intended solar cell substrates can be done at yet another location by a different manufacturer, if so desired.

The pattern formed by the transferable composition of the present invention can appear as a spaced arrangement of lines (e.g., as a grid including fingers and/or bus bars) or alternatively, as a more continuous pattern forming a coating or a layer of the composition on the transfer membrane, and subsequently on the desired substrate. As used herein, the term pattern encompasses any and all shapes a transferable composition and its transferred (e.g., conductive) counterpart (and mirror image) may adopt for the manufacturing of a desirable product (e.g., solar cell, PCB, flip-chip interconnect board, printed flexible circuit, touch screen, RFID tag, etc.). Furthermore, as the particles providing the transferable composition its intended role (functional or decorative) are not limited to electrically conductive ones, the transferred counterpart can be other than conductive, decorative patterns being typically able to encompass a wider variety of arbitrary or fanciful shapes.

In a first aspect of the present invention, there is provided a transferable conductive composition. The composition comprises:

i. a swellable polymer swelled with a swelling agent; and
    ii. a plurality of decorative (e.g., pigments) or functional (e.g., electrically conductive) particles.

Swellable Polymer

The swellable polymer and its swelled counterpart are each selected and adapted to fulfill a number of functions as detailed herein. For instance, they enable the dispersion of the particles in the composition formed thereby, they enable the application of the composition in a desired pattern onto (e.g., upon or within) a transfer membrane, they enable the release of the composition and pattern formed thereby from the transfer membrane and their transfer to a substrate, they enable the adhesion to the substrate of the composition and pattern transferred thereto, and, in the event that the particles providing the transferable composition its function are electrically conductive, the polymers allow for the transferred composition and pattern formed thereby to become electrically conductive, optionally upon application of sufficient energy.

As used herein in the specification and the appended claims, and unless otherwise stated or clear from context, the term "swellable polymer" refers to a polymer which, upon penetration of a swelling agent (e.g., an organic solvent) into its polymeric network, gains in volume (and in weight) rather than being dissolved or simply dispersed in essentially the same non-expanded form in the solvent. Following swelling (e.g., under stirring and heating), a swellable polymer (which can then also be referred to as a swelled or swollen polymer) is said to form a solvated gel-like composition. The gel is typically opaque.

While to achieve such a swollen gel state, the swellable polymer (or mixture thereof) should preferably substantially not dissolve in the swelling agent (or blend thereof), swellable polymer(s) that may dissolve at a concentration not exceeding 10 wt. % by weight of the swelling agent(s) may be considered in some embodiments. Advantageously, the swellable polymers should dissolve in the swelling agents by less than 5 wt. %, less than 2 wt. %, less than 1 wt. %, less than 0.5 wt. %, or less than less than 0.1 wt. %. When this information is not readily available for a particular combination of swellable polymer(s) and swelling agent(s), this can be assessed by adding a predetermined weight of the polymer(s) in the swelling agent(s), mixing at room temperature and observing the appearance of the mixture. The concentration of polymer(s) at which the mixture shift from transparent to turbid (or any other detectable sign of gel formation) can serve as an estimate of the upper limit of solubilization of the polymer (or mixture thereof) in the swelling agent (or blend thereof).

Different forces can take place during expansion of the polymeric network as a result of swelling, including for instance hydrophilic/hydrophobic and/or ionic interactions. The level of swelling that can be achieved by a swellable polymer depends inter alia on the degree of crystallinity of the polymer, the amount of cross-linking, the strength of attractive and repulsive forces, as well as the identity of the swelling agent, some liquids being more potent than others, given a particular polymer. Any given pair of swellable polymer and swelling agent may reach a different point of equilibrium, above which the particular polymer can no longer absorb the specific swelling agent and further expand. The opposite event, known as deswelling, occurs when the swelling agent is released from the polymer matrix, and it can be caused, for instance, by the application of heat to the swollen matrix.

Information about the swellability of a polymer is generally provided by the suppliers of such materials, who may even rank suitable swelling agents and their relative potency to expand the polymeric network. Swellability can be independently determined by standard methods and routine measurement known to the skilled polymer chemist, such as according to ASTM D2765, or any other method where, by way of example, a predetermined weight of the polymer is incubated in the presence of an excess amount of swelling agent for a sufficiently long period of time allowing the system to reach equilibrium. At this point, when the weight of the polymer no longer increases, excess of swelling agent can be removed and the weight gained can be divided by the initial weight of the polymer to calculate the swelling extent or the percentage of swelling on a weight per weight basis. This can be mathematically expressed by the equation: swelling $\% = (Ws-Wd)/Wd \times 100$, wherein Ws represents the weight of the swollen polymer and Wd the initial weight of the polymer before exposure to the swelling agent.

A swellable polymer need not be at its maximum swelling extent (i.e. point of equilibrium) with respect to the swelling agent used therewith to be suitable for the present invention. The extent of swelling at such an intermediate stage or while preparing a transferable composition can be assessed as above described.

However, as already mentioned, the swellable polymer may need to remain in swollen state for efficient transfer to occur. At this stage, the composition including the swelled polymer, also includes the (e.g., electrically conductive) particles, and any other desired additive. The relative amount of swelling agent can be approximated by routine experimentation according to methods known to the skilled persons, such as by drying a known amount of composition and measuring the weight lost in the process. The drying can be performed at a temperature determined for instance by thermogravimetric analysis (TGA) as corresponding to the temperature of elimination of the swelling agent. For instance, a sample of composition/pattern/transfer membrane ready for transfer can be dried for 24 hours in a vacuum oven at 200° C. A sample losing less than 5% or less than 10% of its weight is likely to contain an insufficient amount of swelling agent. Further analysis may allow converting the loss in weight percent to a loss in volume percent.

Since to be sufficiently transferable, the composition should comprise a swellable polymer retaining at least 10 wt. % or 10 vol. % of swelling agent at the time of transfer, and preferably at least at 15 wt. % or 15 vol. %, or at least 20 wt. % or 20 vol. % of swelling agent, a material being unable to swell the swellable polymer by at least 10%, at least 15%, or at least 20% upon preparation of the composition would not be suitable.

While the presence of a swelling agent may be required to improve transfer of the transferable composition comprising the swellable polymer, such compounds may no longer be necessary once the pattern is transferred to its intended substrate. In some embodiments, and in particular when the transferred pattern is post-treated to facilitate or enable its intended use, the swellable polymer and/or the swelling agent can be selected so as to be eliminated by the post-treatment. For instance, the swellable polymer and/or the swelling agent can be selected to have a relatively low melting or boiling temperature (e.g., 250° C. or less), their removal post-transfer being facilitated by heating the transferred pattern to temperatures moderately higher (e.g., 300° C. or less, accordingly). Similar considerations may be applied to other additives of the transferable composition, such as dispersing agents, rheology modifiers and the like, as can be appreciated by a skilled person.

Besides the compatibility necessary between swellable polymers and their swelling agents (which may each be used alone or in combination), and more generally between any and all of its other constituents (e.g., particles, dispersing agents, glass frits, rheology modifiers etc.), a transferable composition comprising the same needs also be compatible with the transfer membrane upon which it is to be applied. Swellable polymers having a relatively low melting point and/or swelling agents having a relatively low boiling point allow using a wider variety of membranes able to sustain such temperatures.

Transferable compositions comprising swellable polymers having a relatively high melting point and/or swelling agents having a relatively high boiling point would require transfer membranes that can sustain such relatively elevated temperatures, which could limit the types of membranes that may be used for the application of the transferable compositions.

A membrane having a heat resistance higher by 10° C. or more, by 20° C. or more, or by 30° C. or more than the highest of the swellable polymer melting point and the swelling agent boiling point is expected to be suitable or adapted, at least temperature-wise, to the transferable composition.

Transfer membranes suitable for the application of transferable compositions as herein described and methods for their manufacturing shall be detailed in following sections.

Considering the subsequent usage of a transfer membrane having applied thereto a transferable compositions as herein disclosed, it may be advantageous, but not essential, to select the swellable polymers and the swelling agents so as to permit a rapid transfer of a pattern including them and the (e.g., electrically conductive) particles dispersed therein from the membrane to a (e.g., solar) substrate. To facilitate the transfer, the substrate and/or the membrane including the pattern to be transferred may be heated prior to or during contacting. Understandingly, swellable polymers having a relatively high melting point would require a higher temperature and/or a longer heating period to sufficiently soften to satisfactorily transfer (e.g., transferring in full, with no split of the pattern between the transfer membrane and the intended substrate). Prolonging the transfer process and/or increasing the transfer temperature would decrease the process efficiency and speed. As explained, to the extent that reduction or elimination of the swellable polymer is desired following transfer, it can be beneficial to use a swellable polymers having a relatively low melting point facilitating the reduction or elimination of the polymer in a post-transfer treatment of the pattern.

Hence, while various swellable polymers may have a variety of melting points, which for practical reasons of handling and/or storage are generally of 50° C. or more, in one embodiment, the swellable polymer advantageously has a melting point of at least 60° C., at least 70° C. or at least 80° C. In another embodiment, the swellable polymer has a melting point of at most 250° C., at most 200° C., at most 150° C., at most 140° C., at most 130° C., at most 120° C., at most 110° C., or at most 100° C. In yet another embodiment, the swellable polymer has a melting point within the range of 50° C. to 250° C., 60° C. to 200° C., 65° C. to 150° C., 65° C. to 140° C., 65° C. to 130° C., 70° C. to 120° C., or 70° C. to 100° C.

Likewise, while various swelling agents may have a variety of boiling points, some even lower than the boiling point of water, they are generally individually selected or mixed with one another to have an individual or combined boiling point of 90° C. or more. In one embodiment, the swelling agent (or a mix thereof) advantageously has a boiling point of at least 100° C., at least 110° C., at least 120° C., at least 130° C., at least 140° C., at least 150° C., or at least 160° C., the boiling point optionally being of at most 450° C., at most 400° C., at most 350° C., at most 300° C., at most 290° C., at most 280° C., at most 270° C., at most 260° C., or at most 250° C. In another embodiment, the boiling point of the swelling agent(s) is within the range of 90° C. to 450° C., 100° C. to 450° C., 100° C. to 400° C., 100° C. to 350° C., 100° C. to 300° C., 105° C. to 290° C., 110° C. to 280° C., 115° C. to 270° C., 120° C. to 300° C., 120° C. to 250° C.; 130° C. to 400° C., 160° C. to 350° C., 150° C. to 300° C., or 150° C. to 250° C.

While in previous paragraphs, reference is made to the melting temperature of a swellable polymer as facilitating the selection of a suitable compound, this terminology is generally used in connection with sufficiently crystalline polymers. Such temperatures are provided by suppliers of the material but can be assessed by routine experimentation according to methods known to the skilled persons, for instance by using Differential Scanning calorimetry (DSC), such as described in ASTM 3418, ISO 3146 or ISO 11357-3.

For selection of swellable polymers adapted to the present teachings, for instance being suitable for application or transfer temperatures in a range between 60° C. and 180° C., reference can alternatively be made to the softening temperature of the polymer. As used herein, the term "adapted" should not be construed to imply that a material need be modified before use, but that a material is appropriate. The terminology of softening temperature is typically used with respect to amorphous or semi-crystalline polymers. Softening temperatures can also be provided by the polymer manufacturer or be measured by routine experimentation. Vicat softening temperature, for instance, can be assessed according to ASTM D1525 or ISO 306. Vicat softening temperatures are typically lower than melting temperatures of polymers by about 20° C. to 30° C. In one embodiment, the Vicat softening temperature of the swellable polymer is 30° C. or more, 40° C. or more, 50° C. or more, or 60° C. or more. In one embodiment, the swellable polymer has a softening point of at most 220° C., at most 180° C., at most 160° C., at most 140° C., or at most 120° C., at most 100° C., or at most 80° C. In another embodiment, the swellable polymer has a softening point within the range of 30° C. to 140° C., 40° C. to 120° C., or 50° C. to 100° C.

A melting or softening temperature in a range adapted to the subsequent use of the transferable composition or of a pattern formed thereby in methods according to the present teachings can optionally be achieved by mixing a swellable polymer having a melting or softening point relatively higher than desired from a process or use viewpoint with a plasticizer able to reduce such phase transition temperatures. The plasticizer may additionally be adapted to be at least partially or fully eliminated in a post-transfer treatment, if its presence can negatively affect the intended use of the pattern or if no longer required for any other reason. As other additives of the transferable composition, the plasticizer should be compatible with the gel-like swollen polymer composition and should preferably not dissolve the polymer or at least not dissolve it to an extent affecting its swellability by the swelling agents, according to the present teachings.

In one embodiment, the swellable polymer is thermoplastic. As such, it is selected from a group consisting of an amorphous thermoplastic polymer, a semi-crystalline thermoplastic polymer, and a crystalline thermoplastic polymer.

A suitable swellable polymer may have an average molecular weight (MW) of at least 1,000 Dalton, or at least 10,000 Dalton, or at least 50,000 Dalton. In one embodiment, the average molecular weight of swellable polymer suitable for the present invention is at most 1,000,000 Dalton, at most 500,000 Dalton, or at most 250,000 Dalton. In a further embodiment, the average molecular weight of swellable polymer suitable for the present invention is between 1,000 Dalton and 500,000 Dalton, between 10,000 Dalton and 300,000 Dalton, or between 100,000 Dalton and 250,000 Dalton. When used in connection with swellable polymers which may be supplied as populations of mildly diverging molecules (e.g., having a slightly different number of repeating units), the term molecular weight relates to the weighted or weight average MW, unless indicated otherwise by the supplier. The weight average MW can be measured by standard methods, e.g., by size exclusion chromatography or gel permeation chromatography.

The Melt Flow Rate (MFR) or Melt Flow Index (MFI) is another parameter indicative of the swellable polymer's MW, with low MW polymers having a conversely high melt flow rate. The MFR assesses the ease of flow of the melt of a polymer and it is defined as the mass of a sample of pre-heated polymer, in grams, flowing in ten minutes through a capillary of a specific diameter (e.g., 2 mm) and length (e.g., 8 mm) by a pressure applied via a prescribed load (e.g., 2.16 kg) at a predetermined temperature typically adapted to the polymer chemical structure (e.g., 190° C.). Besides being an indirect measure of molecular weight, the MFR is indicative of the ability of the material's melt to flow under pressure and is inversely proportional to the viscosity of the melt at the conditions of the test in the plastometer.

In one embodiment, the swellable polymer has a melt flow rate of at least 0.2 g/10 min, at least 0.3 g/10 min, at least 0.5 g/10 min, or at least 1 g/10 min and at most 100 g/10 min, when measured with a gravimetric weight of 2.16 kg at a temperature of 190° C. The swellable polymer can have its MFR in a range between 0.2 g/10 min and 100 g/10 min, between 0.5 g/10 min and 50 g/10 min, between 1 g/10 min and 100 g/10 min, between 1 g/10 min and 75 g/10 min, between 1 g/10 min and 50 g/10 min, between 2 g/10 min and 50 g/10 min, or between 2 g/10 min and 25 g/10 min. Melt flow rates are generally provided by the polymer manufacturers but can be independently determined by methods known to the skilled polymer chemist, such as according to ASTM D1238-13 and ISO 1133.

Without wishing to be bound by any particular theory, the melt flow rate is believed to also be indicative of the relative hardness a swelled polymer may display. Taking for illustration a same amount of two swellable polymers each swollen with a same amount of a same swelling agent under similar conditions, following swelling the swellable polymer having a higher MFR (lower MW) will form a softer/laxer gel-like structure than the swellable polymer having a lower MFR (higher MW), which will be relatively firmer or harder Another parameter that may be taken into consideration for the selection of a swellable polymer suitable for a transferable composition according to the present teachings is the "pot life" it may confer to the composition. As used herein, the term "pot life" is not intended to suggest that the polymer is involved in any reaction taking place, or not, in the transferable composition, but simply to refer to the duration of time during which the composition could be used or usable following its preparation. In other words, for how long the composition would display a stable enough viscosity allowing its application to a transfer membrane by any suitable mean selected for this process. As readily appreciated by persons skilled in workability of polymers, beyond a viscosity level dependent inter alia on the elected application device, the desired pattern and its location upon or within a transfer membrane, a composition may cease to be applicable to the membrane in a satisfactory manner.

An additional parameter that may be taken into consideration for the selection of a swellable polymer suitable for a transferable composition according to the present teachings is the "open time" of the polymer. While related to the pot life of the composition prior to its application to a desired flexible membrane, the term open time is typically used to more specifically relate to the behavior of the polymer during subsequent transfer. The open time generally refers to the period of time a polymer has sufficient motility to assume a desired shape, such a value depending upon the conditions (e.g., temperature or pressure) to which the polymer is subjected. The open time of a swellable polymer affects in turn the malleability of a transferable composition comprising it. The open time of the polymer may depend on the temperature it is subjected to, hence selecting a satisfactory open time may depend inter alia on the conditions intended for the use of the transferable composition. Swellable polymers having an open time sufficiently long to allow proper transfer of the pattern of the transferable composition to the substrate, following its heating to an elevated transfer temperature, while being sufficiently short to maintain the desired shape following transfer and adhesion to the substrate, are considered suitable. Open times of less than a few seconds, less than one second, less than hundreds or even tens of a millisecond are deemed satisfactory for swellable polymers suitable for the present invention.

Swellable polymers having a low ash content are deemed advantageous, as they are expected to facilitate sintering of the electrically conductive particles when made of metals or alloys.

In one embodiment, the swellable polymer is selected from: ethylene/vinyl acetate (EVA) co-polymer, such as commercially available Bynel® 3101, Bynel® 3861 (having a vinyl acetate content (% VA) of 25%), Elvax™ 350 (25% VA), Elvax™ 410 (18% VA), Elvax™ 420 (18% VA), Elvax™ 470 (18% VA) and Elvax™ 670 (12% VA) (DuPont, USA); acid modified ethylene acrylate resin, such as Bynel® 2022 (DuPont, USA); ethylene/acrylic ester/maleic anhydride ter-polymer, such as Lotader® 4700 (Arkema, France); polyvinyl butyral (PVB), such as Butvar® B-72, Butvar® B-74, Butvar® B-76, Butvar® B-79, Butvar® B-90, or Butvar® B-98 (Eastman, US or Kuraray, JP); polyvinyl alcohol (PVA), such as Poval™ Lm-30 (Kuraray, Japan); and polyamides. Such polyamides can be, inter alia, ester-terminated polyamide, such as CrystaSense™ LP1 (Croda, UK), polyaminoamides or polyester-amide.

In a particular embodiment, the swellable polymer is an EVA co-polymer, which can optionally be grafted (e.g., anhydride grafted), the co-polymer having vinyl acetate content (% VA) of at least 5 wt. %, at least 10 wt. %, at least 15 wt. %, or at least 20 wt. % by weight of the polymer. In some embodiments, the swellable polymer is an EVA co-polymer having a vinyl acetate content of at most 55 wt. %, at most 40 wt. %, or at most 30 wt. %. In further embodiments, the EVA co-polymer has a vinyl acetate content between 5 wt. % and 50 wt. %, between 10 wt. % and 40 wt. %, between 10 wt. % and 30 wt. %, or between 15 wt. % and 30 wt. %. The vinyl acetate content of an EVA co-polymer if generally provided by the manufacturer but can be independently assessed by routine experimentation according to methods known to the skilled persons, for instance by using Fourier Transform Infrared (FT-IR) spectroscopy, such as described in ASTM D5594.

Typically, the amount of swellable polymer is measured in volume percent (vol. %) by the volume of all solids in the transferable composition, e.g., the swellable polymer, the (electrically conductive) particles and the glass frits, when present. The volume of each component can be calculated according to the component's density and its solid weight.

In one embodiment, the swellable polymer is present in the swellable composition at a volume concentration of at least 1 vol. %, at least 2 vol. %, at least 5 vol. %, at least 10 vol. %, or at least 15 vol. % of the volume of all solids in the composition. In one embodiment, the swellable polymer is present in the swellable composition at a volume concentration of at most 80 vol. %, at most 60 vol. %, at most 40 vol. %, or at most 30 vol. % of the volume of all solids in the composition. The swellable polymer can for instance be present in the composition at a volume concentration within a range of 1 to 60 vol. %, 1 to 40 vol. %, 5 to 30 vol. %, 2 to 25 vol. %, 5 to 25 vol. %, 10 to 25 vol. %, 10 to 22 vol. % or 15 to 22 vol. % of the volume of all solids in the composition.

Swelling Agent

As long as it is able to swell the swellable polymer, instead of dissolving it or dispersing it in a non-expanded form, any suitable swelling agent can be used. In other words, the swelling agent should not be miscible with the swellable polymer and vice versa. While swelling agents unable to dissolve a particular polymer exist and may be preferred, a minor miscibility can be tolerated. A swelling agent unable to dissolve at room temperature more than 10 wt. % of the swellable polymer, and advantageously dissolving less than 5 wt. %, less than 2 wt. %, or less than 1 wt. % of the polymer when the swelling agent is present in an excess of 100-fold with respect to the polymer, can be suitable. The ability of a liquid, serving herein as swelling agent, to dissolve a particular polymer can be known from literature or provided by the manufacture of the polymer. It can be assessed by adding a predetermined amount of a swellable polymer to an excess of the swelling agent, allowing it to swell under suitable stirring and heating conditions, and removing the swelled polymer, for example by filtration. The swelling agent is in an excess so that the volume of filtrates remaining following separation of the swollen polymer constitute about 10% by volume of the swollen polymer. In other words, if the addition of a swellable polymer to a swelling agent results in a gel-like structure having a volume of about 100 ml, the swelling agent should be in an excess of 10 ml. This volume of swelling agent, prospectively containing dissolved polymer, can then be analyzed for the presence of the polymer and its quantity accordingly calculated. Alternatively, the swelling agent of the filtrate can be eliminated by evaporation for at least 12 hours at a temperature mildly greater than its boiling point (e.g., 10 to 20 degrees higher). The residue remaining following volatilization of the swelling agent can be assumed to represent the maximal weight of the swellable polymer that would have dissolved in the swelling agent rather than being swollen thereby, and the extent of possible dissolution accordingly calculated.

As mentioned, information concerning the ability of a particular solvent to swell a specific polymer is generally provided by the polymer manufacturers but can also be experimentally determined as explained. Such liquids can be classified as aqueous solvents, if consisting of water or containing water and water miscible compounds, and organic solvents. Neither type of liquid solvents need be pure (e.g., 95 wt. % or more, 97.5 wt. % or more or 99 wt. % or more) and each may contain a mixture of aqueous solutions or a mixture of organic solvents, respectively. Furthermore, a predominantly aqueous solvent may in some embodiments still contain some inorganic or organic components or solvents (e.g., 25 wt. % or less, 20 wt. % or less, 15 wt. % or less, 10 wt. % or less, or 5 wt. % or less) and/or conversely a predominantly organic solvent may in some embodiments still contain some aqueous components (e.g., 25 wt. % or less, 20 wt. % or less, 15 wt. % or less, 10 wt. % or less, or 5 wt. % or less). Thus, conversely, an aqueous solvent can be defined by a water content of at least 75 wt. %, at least 80 wt. %, at least 85 wt. %, at least 90 wt. %, or at least 95 wt. % of such aqueous swelling agent.

While swelling agents forming a single phase are expected to be preferable for a more uniform swelling of the swellable polymer, this is believed to be not essential, and swelling agents forming a bi-phasic system (e.g., an emulsion) may also be used to swell the swellable polymer. While aqueous solvents are generally preferred for environmental considerations, organic solvents may be advantageous from the viewpoint of the process, a relatively high boiling point allowing to delay deswelling.

The swelling agent is preferably a liquid having a relatively low viscosity, so that upon mixing with the swellable polymer, the (conductive) particles and any other additive, the resulting transferable composition has a viscosity adapted for its application onto a transfer membrane, at the temperature of application. In one embodiment, the swelling agent is a liquid having a relatively low viscosity not exceeding 1,000 mPa·s, being typically of no more than 500 mPa·s, no more than 250 mPa·s, no more than 200 mPa·s, or no more than 150 mPa·s at room temperature between 20° C. and 25° C. The viscosity of the swelling agent can be provided by the manufacturer or be measured by routine experimentation, e.g. according to ASTM D445. While these values are provided as measured at 20-25° C., these temperatures being often the ones reported by manufacturers, it can readily be appreciated that at the temperature of preparation, application or transfer described herein, the swelling agent may display a lower viscosity.

The swelling agent can have a vapor pressure sufficiently high to be rapidly eliminated following transfer, but sufficiently low, so that upon mixing with the swellable polymer, the (conductive) particles and any other additive, the resulting transferable composition retains a sufficient amount of swelling agent within the swollen polymer, so that upon transfer the amount of swelling agent per swellable polymer is no less than 10 wt. %, being advantageously of 15 wt. % or more, or 20 wt. % or more. A vapor pressure suitable for swelling agents according to the present teachings may be of at least $10^{-6}$ kPa, at least $10^{-5}$ kPa, at least $10^{-4}$ kPa, at least $5*10^{-4}$ kPa, or at least $10^{-3}$ kPa. In some embodiments, the swelling agent has a vapor pressure of at most 5 kPa, at most 4 kPa, at most 3 kPa, at most 2 kPa, or at most 1 kPa, at most 0.5 kPa, at most $10^{-1}$ kPa, at most $5*10^{-2}$ kPa, or at most $10^{-2}$ kPa. In other embodiments, the swelling agent has a vapor pressure in a range of $10^{-6}$ kPa to 5 kPa, $10^{-5}$ kPa to 5 kPa, $10^{-4}$ kPa to 5 kPa, $10^{-3}$ kPa to 2.5 kPa, $10^{-6}$ kPa to 0.5 kPa, $10^{-6}$ kPa to $10^{-1}$ kPa, or $10^{-6}$ kPa to $10^{-2}$ kPa. The vapor pressure of the swelling agent (or blends thereof) can be determined by standard methods, such as described for instance in ASTM E1194 and E1782, circa room temperature between 20° C. and 25° C.

Without wishing to be bound by any particular theory, it is believed that the swollen state of the polymer facilitates transfer of a transferable composition comprising it. Thus, while a portion of the swelling agent can be intentionally or inadvertently eliminated during any of the steps preceding transfer, a non-negligible residual amount (e.g., 10 vol. % or more) is desired for the pattern to satisfactorily transfer from the membrane to the substrate. The swelling agent preferably evaporates relatively slowly at temperatures below a temperature of transfer. A swelling agent having a relatively low flash point or boiling point, has a higher rate of evaporation than another swelling agent having a relatively higher flash point or boiling point. As already mentioned, the swelling agent can have a boiling point within the range of 90° C. to 450° C.

When the (electrically conductive) particles added to the swellable polymers and their swelling agents are metals that can react with water, the presence of water above a certain amount in the swelling agent can be deleterious. For instance, aluminum could dangerously react with water, forming hydrogen. Thus, while a predominantly organic swelling agent may comprise up to 25 wt. % water or similarly aqueous components, in one embodiment, the swelling agent is an organic solvent containing at most about 1.0 wt. %, at most 0.5 wt. %, at most 0.1 wt. %, at most 0.05 wt. % or at most 0.01 wt. % water.

Alternatively or additionally, (electrically conductive) particles sensitive to the presence of water can be protected by appropriate agents, thus minimizing or preventing their reaction with an aqueous environment, optionally allowing using a swelling agent with a water content higher than 1 wt. %. Such protection can be provided by suitable surfactants or wetting agents which may envelop the particles by adsorption to their outer surfaces. For instance, anionic phosphate esters, such as commercially available Sophor® 3 D 33 (Solvay, Belgium) or Hostaphat® 1306 (Clariant, Switzerland), and alcohol alkoxylates, such as BYK-3410 (BYK, Germany) can, in a suitable amount, provide satisfactory protection to water-sensitive particles. The presence of such water-protective agents (e.g., phosphate esters) on or with the particles allows the use of water or aqueous swelling agents and of polymers swellable thereby for the preparation of the transferable composition. For example, protected particles can be incorporated in a transferable composition where the premix includes PVA polymers swelled with water or with a solution of an alcohol in water.

For compositions wherein the particles are not prone to react with water (e.g., noble metals, such as silver, nonmetallic conductive materials, or non-conductive particles, such as pigments), the swelling agent can be or contain water.

A person skilled in swellable polymers can readily appreciate which swelling agents are adapted for each type of polymer. For instance, when the swellable polymer is an EVA co-polymer, a suitable swelling agent can be a $C_{6-20}$ isoparaffin, such as commercially available Isopar™ M, Isopar™ C, Isopar™ E, Isopar™ G, Isopar™ H, Isopar™ L, or Isopar™ V (Exxon Mobil Corp, USA) or a polyethylene oxide (PEO; also known as high molecular weight polyethylene glycol (PEG)); for PVB polymers, suitable swelling agents can be selected from: $C_{3-10}$ ketones, such as acetone, methyl ethyl ketone or diisobutyl ketone; $C_{1-12}$ alcohols, such as methanol or butanol; and $C_{6-10}$ aromatic hydrocarbons, such as xylene or toluene. Glycerin, as well as previously described alcohols, water and combinations thereof, can serve as swelling agents for PVA polymers. If desired, swelling agents can be mixed with one another. For instance, the swelling agent can be a mixture of a first agent having a high boiling point but a relatively high viscosity, possibly delaying its absorption, with a second agent having a low viscosity to "dilute" the first agent, even if the second agent by itself has a boiling temperature that may be less suitable if used in isolation.

Upon preparation of a transferable (conductive) composition, the weight per weight ratio of the swellable polymer to the swelling agent, SP/SA, is at least 1:99, at least 1:49, at least 1:19, at least 1:10, or at least 1:5. While depending on the swellable polymer and the swelling agent, the latter can be in significant excess (e.g., yielding a SP/SA ratio of up to 1:100), in some embodiments, the transferable (conductive) composition is prepared to include a SP/SA wt./wt. ratio of at most 9:1, at most 6:1, at most 4:1, at most 3:1, at most 2.3:1, at most 1.5:1, at most 1:1, or at most 0.5:1. Usually, transferable (conductive) compositions are prepared and applied to a transfer membrane while the SP/SA ratio is between 1:99 and 9:1, between 1:49 and 6:1, between 1:49 and 4:1, between 1:49 and 1.5:1, between 1:19 and 3:1, between 1:19 and 1:1, between 1:10 and 1:1, between 1:10 and 0.5:1, or between 1:5 and 0.5:1. In a particular embodiment, the SP/SA ratio is 1:2.5, 1:3, 1:3.5, or 1:4. While in the above, the weight ratio of the two materials has been provided in terms of SP/SA, the converse ratio of SA/SP can be readily derived, a SP/SA ratio of at least X being equivalent to a SA/SP ratio of at most X and a SP/SA ratio of at most Y being equivalent to a SA/SP ratio of at least Y.

While a portion of the swelling agent may be spontaneously or deliberately eliminated during the preparation, application or subsequent storage of the transferable composition once applied to a transfer membrane, it is necessary that at least part of it remain in the transferable pattern at the time of transfer to a substrate. Hence, in a transferable (conductive) composition applied on a transfer membrane, the weight per weight ratio of swelling agent to swellable polymer, SA/SP, in the swelled polymer is at least 1:9, at least 1:7, at least 1:5, at least 1:4, at least 1:3, or at least 1:2, such ratio typically not exceeding 10:1.

Considered by weight or by volume of the entire transferable composition, the swelling agent should remain present upon transfer at at least 10%, at least 15% or at least 20% of the weight or volume of the composition, respectively.

Electrically Conductive Particles

As used herein, the term "electrically conductive particles" encompasses particles including or consisting of any conductive material, including metals, metal oxides, metal salts, organo-metals, alloys and conductive polymers, as well as any electrochemically compatible combinations of the foregoing (e.g., a mixture of two metals, aluminum and silver). This term includes particles made of such electrically conductive materials or at least partially coated thereby to an extent sufficient for the particles to provide enough electrical conductivity to the end-product. By electrochemically compatible, it is meant that any conductive material of any layer is chemically inert with respect to any other conductive material of the same layer, or of other layers when the application onto the transfer membrane (upon its surface and/or within grooves formed therein) is done by repeated coating/filling sub-steps. In particular, none of the materials are deleterious to the intended effect, more specifically not affecting the electrical conductance and/or conductivity of the ultimate conductive pattern that can be obtained by the present method, nor their ability to properly attach to the substrate in due time following transfer.

Particles are said to be made of a particular material if they include, mainly include (e.g., containing 50.1-75 wt. %), predominantly include (e.g., containing 75.1-95 wt. %), or consist essentially (e.g., containing 95.1-100 wt. %) of the material, any component other than pure material present in the particles not being deleterious to their function.

Metals can be selected from the group comprising aluminum, copper, gold, silver, tin, nickel, platinum, zinc; and alloys can be selected from the group comprising bronze, brass and palladium/silver. Organo-metals can be selected from the group comprising copper(II) formate ($C_2H_2CuO_4$), copper(II) hexanoate ($C_{12}H_{22}CuO_4$), copper(I) mesitylene ($C_9H_{11}Cu$), vinyl-trimethylsilane Cu(I) hexafluoro-acetylacetonate, silver neodecanoate ($C_{10}H_{19}AgO_2$), precursors, hydrates and/or salts thereof.

When metallic particles are desired for preparing conductive patterns (e.g., for solar cells), metals having an electrical conductivity of at least $1\times10^6$ Siemens/meter (S/m, measured at 20° C.) can be selected. In some embodiments, the conductivity is at least $3\times10^6$ S/m, at least $5\times10^6$ S/m, or at least $7\times10^6$ S/m. Alternatively, this property can be expressed as the resistivity of the material from which the particles are made. In some embodiments, the resistivity is at most $1\times10^{-6}$ Ω·m (measured at 20° C.). When other electrically conductive particles are desired, e.g., organo-metals, they may be made of materials having a lower conductivity (or higher resistivity) than afore-mentioned, as readily assessable by someone skilled in the art. When electrically conductive particles are used for decorative purposes, their conductivity need not fulfil any particular threshold.

The particles can have a core made of a first substance, the particles being at least partially coated with a second material providing the particles their intended effect (e.g., decorative or functional). For electrically conductive particles, the core can be shaped as a sphere-, a flake- or a rod-like element made of glass (e.g., boron silicate), ceramic (e.g., silica), natural polymer (e.g., latex), synthetic plastic (e.g., polyethylene) or carbon, such cores being coated by a metal as afore-listed. Some coated particles can have a core made of a first metallic substance (e.g., copper), the external coat being of a distinct metallic substance (e.g., silver).

In a particular embodiment, when the transferrable composition is used for the preparation of a pattern on a membrane which following contact with a solar wafer and transfer of the pattern thereto forms a back electrode on the rear-side of the substrate, the electrically conductive particles are made of aluminum.

A suitable volume concentration of electrically conductive particles is at least 20 vol. %, at least 30 vol. %, at least 40 vol. %, at least 65 vol. %, at least 70 vol. %, or at least 75 vol. % by volume of all solids in the composition (e.g., electrically conductive particles, swellable polymer and glass frits, if present). In some embodiments, the volume concentration of electrically conductive particles is at most 98 vol. %, at most 95 vol. %, at most 90 vol. %, at most 85 vol. %, at most 80 vol. %, or at most 75 vol. % by volume of all solids; and optionally between 20 vol. % and 98 vol. %, between 30 vol. % and 95 vol. %, between 40 vol. % and 90 vol. %, between 65 vol. % and 98 vol. %, between 70 vol. % and 95 vol. %, or between 75 vol. % and 90 vol. % of all solids volume.

While the present section has detailed functional particles being electrically conductive, it is reminded that this should not be construed as limiting the scope of the present invention. In another embodiment, the particles need not be conductive, nor even functional in any other way. For instance, when the transferable patterns are used for decorative purposes, the particles can be organic or inorganic pigments or dyes, or any such chromophores which separately or in combination are able to provide a desired tint or coloration to the pattern. The amount of such particles in the transferable composition need not be particularly limited and can be adapted to suit a desirable visual effect.

It can be appreciated that the distinction between "functional particles" providing a function (e.g., allowing the formation of an electrical circuit) and particles providing a visual effect, termed herein "decorative particles" is made for clarity concerning the predominant effect being sought. It is understood that a functional conductive pattern also provides a visual effect, yet the particles in this case are deemed functional. Similarly, the distinction between functional and decorative particles does not necessarily mean that the particles differ. Taking for instance metallic particles, they may alternatively be functional (ab initio, e.g., serving, for instance, for PCBs or RFIDs, without being further sintered or fired, or following any such "functionalization", e.g., serving for solar cells) or decorative (e.g., forming a metallic-looking pattern).

Glass Frits

The transferable composition may, in addition to the swellable polymer, the swelling agent and the (e.g., electrically conductive) particles, optionally further contain glass frits which may inter alia etch the surface of the solar wafer (e.g., the front side) and improve the adhesion between the optionally sintered particles (e.g., metals) and the wafer following application, if necessary, of elevated temperatures to the transferred pattern. Prior to transfer and optional sintering, glass frits may additionally serve as a binder and/or rheological modifier to the transferable composition. Additionally, glass frits may serve to protect the electrically conductive particles, e.g., from the humidity in the air. The glass frits are compatible with other components of the transferable conductive composition (e.g., the swellable polymer, the swelling agent, or the electrically conductive particles) and the process conditions, for instance, providing for a suitable flowability of the composition onto the flexible membrane or within grooves formed therein and/or excess removal from the membrane surface, being non-brittle to maintain pattern integrity, or being sufficiently "heat resistant" if sintering of the electrically conductive particles is desired, in order to remain in an amount maintaining adequate shape.

Glass frits suitable for c-Si solar cells are generally made of the following glasses: i) Lead oxide (PbO) based glasses, usually lead borosilicate glass: $PbO$— $SiO_2$—$B_2O_3$; ii) Bismuth oxide ($Bi_2O_3$) based glasses, usually bismuth borosilicate glass: $Bi_2O_3$— $SiO_2$— $B_2O_3$, and strontium bismuth borosilicate glasses: $SiO_2$— $SrO$— $Bi_2O_3$— $B_2O_3$; iii) Tellurium oxide ($Te_2O$) based glasses; and iv) vanadium pentoxide ($V_2O_5$) based glasses. In some embodiments, combinations of glass frits are used.

Glasses based on lead oxide, bismuth oxide and tellurium oxide, as complement to the silica ($SiO_2$), are generally suitable for standard c-Si cells, whereas glass frits that are less abrasive or corrosive are preferred for PERC cells. Thus, bismuth oxide, vanadium pentoxide, lead oxide and zinc oxide (ZnO) glasses, preferably further containing boron oxide ($B_2O_3$), as well as mixtures thereof, are more favored for PERC cells, glass frits made of such materials not being detrimental to the passivating layer on the back side of this particular type of solar cells.

Each of the above glasses may also contain, in addition to the silica, one or more of the following: aluminum oxide ($Al_2O_3$), barium oxide (BaO), magnesium oxide (MgO), molybdenum oxide ($MoO_2$), molybdenum trioxide ($MoO_3$), phosphorus pentoxide ($P_2O_5$), strontium oxide (SrO), tin oxide ($SnO_2$) and tungsten oxide ($WO_3$).

Exemplary glass frits include, for instance, commercially available glass frits 2083 (3M, USA), containing, in addition to the silica, strontium oxide, bismuth oxide, boron oxide and aluminum oxide, and having a CTE of about $86.7 \times 10^{-7\circ}$ $C.^{-1}$ and ASF-1100B (AGC, Japan), containing, in addition to the silica, bismuth oxide and boron oxide, and having a CTE of about $107 \times 10^{-7\circ}$ $C.^{-1}$. Glass frits can alternatively be specifically designed and prepared by a chemist skilled in the art of glass materials by combining and treating the suitable starting materials in desired quantities and ratios. A variety of glass frits can accordingly be prepared, e.g., containing lead oxide, zinc oxide, boron oxide and silica and be suitable for the transferable compositions of the present invention. Exemplary glass frits can be prepared to comprise: silicon dioxide at an amount of between 0.5 wt. % and 4 wt. %, lead oxide at an amount of between 70 wt. % and 85 wt. %, boron oxide at an amount of between 5 wt. % and 15 wt. % and zinc oxide at an amount of between 1 wt. % and 10 wt. %.

The amount of glass frits is generally within the range of 0.1 to 15 vol. %, by volume of the (electrically conductive) particles, preferably within the range of 0.2 to 12.5 vol %., 0.2 to 12.5 vol %., 0.5 to 10 vol. %, 0.5 to 8 vol. %, 0.5 to 6 vol. %, 0.5 to 5 vol. % or 1 to 5 vol. % by volume of the electrically conductive particles.

The presence of glass frits can be recommended when the transferable compositions serve for the preparation of solar cell patterns or for the application of a decorative pattern on a vitreous substrate. In such cases, the glass frits may further the adherence of the transferred pattern to its substrate, which in combination with functional particles may increase the efficacy of the resulting pattern. While glass frits may also serve as a filler, they are typically absent from transferable compositions serving for the formation of conductive patterns for electronic products other than solar cells.

Particle Size

The particles (whether (electrically conductive) particles or glass frits) may have any shape, for instance form regular or irregular spherical beads/flakes/rods and the like, preferably, but not necessarily, the individual particles are devoid of cavities that may prevent proper sintering or firing at a later stage, if such step is required of the composition. When the transferable composition is to be applied within grooves formed in the flexible membrane, the maximum dimension of the particles should be smaller than the groove minimal size in any of its axis/dimension. (e.g., the particles are in the order of a few micrometers, commonly not exceeding 10-20 μm, and often significantly smaller). If the particles serve for a transferable composition being applied upon the outer surface of a transfer membrane, then the constraint on the maximum size can be relaxed and particles of tens of micrometers can be used (e.g., having a maximum dimension of 100 μm or less, 75 μm or less, or 50 μm or less). Depending on their shape, too large particles may not pack satisfactorily within the pattern of transferable composition whether applied to remain onto the surface of the membrane or within grooves therein. Such deficient packing may reduce or prevent the formation of adequately conductive (or otherwise functional) pattern and/or may impair a resulting visual effect. Though smaller particles are easier to pack together, excessively small particles may not, in certain cases, be beneficial, as they may, for instance, undergo uncontrolled sintering at temperatures relatively lower than the sintering temperature of larger particles (e.g., at transfer temperature of about 135° C.). Such premature sintering of particles that are too small may subsequently affect transfer of the composition (hampering flow) and its interfacing with the substrate. Second, the increased surface area of numerous small particles may require the presence of additional swellable polymer, which may in turn affect the rheology of the composition and the workability of the paste. Increased surface area may also entail an augmentation of concentration of certain additives in the transferable composition and, for instance, could necessitate a raise in presence of protective agents for water-sensitive particles. Furthermore, the increased presence of polymer may interfere with sintering (affecting prospective conductivity).

Hence, particles having, depending on the mode of application with respect to the surface of the membrane, an average (D50) or a maximum dimension of at least 200 nanometers (nm); and optionally at most 30 μm, are preferred. In some embodiments, the (electrically conductive) particles have an average or a maximum dimension in the range of 0.5 to 15 μm, 1 to 10 μm, 3 to 5 μm, 3 to 20 μm, or 3 to 30 μm. Populations of particles heterogeneous in size, though not essential for certain shapes, may improve their packing, the smaller particles intercalating between the larger ones, resulting in packing having less inter-particular voids. Such packing may facilitate sintering and/or firing, if needed, and can improve the conductivity of the finished sintered/fired pattern, when such steps are necessary to render a pattern conductive or otherwise functional.

Information about particle size is generally provided by the suppliers, and may be determined by routine experimentation using, Dynamic Light Scattering (DLS) techniques by way of example, where the particles are approximated to spheres of equivalent scattering response and the size expressed as hydrodynamic diameter, the values observed for 50% of the population by volume or by number being respectively referred to as $D_V50$ and $D_N50$. These values, commonly alternatively referred to as D50, are often termed the average particle size. Dimensions of particles may also be estimated by microscopic methods and analysis of images captured by scanning electron microscope (SEM), transmission electron microscope (TEM), focused ion beam (FIB), and/or by confocal laser scanning microscopy techniques. Such methods are known to the skilled persons and need not be further detailed. As particles typically have different sizes in different directions, unless perfect spheres, the longest dimension in the largest plane projecting from the particle is considered for simplicity. When the particles are globular or near spherical, the "longest dimension" is approximately their diameter which can be estimated by DLS methodology.

In such a case, the hydrodynamic diameter of 90% of the population of the particles, but more typically of 50% of the population, can serve to assess the size of the particles. In other words, and depending on shape, the particles can be characterized by their longest length L, by their thickness, by their hydrodynamic diameters at $D_V90$, $D_V50$, $D_N90$ or $D_N50$. When estimated by DLS, volume analysis can be preferred and in one embodiment the average particle size of the particles can be provided as $D_V50$.

Additives

The transferable conductive composition may contain a variety of additional materials, generally referred to as additives. One such type of additives was previously described as a water-protective agent, in the event one seeks to incorporate particles sensitive to the presence of water in a composition where the swellable polymer is swelled with a swelling agent including water, but other types of additives may be alternatively or additionally included. For instance, at least one rheological modifier (e.g., plasticizer) can optionally be added to the blend comprising the swellable polymer and the swelling agent, such addition being typically, but not necessarily, performed ahead of the addition of the (electrically conductive) particles to the composition. Further optionally, at least one dispersing agent can be added to facilitate and/or stabilize the dispersion of the particles within the swollen polymer, such addition being typically, but not necessarily, performed prior to or upon the addition of the electrically conductive or otherwise functional or decorative particles to the swollen polymer blend, optionally containing a rheological modifier or any other desirable additive previously mixed.

As can be readily appreciated, the name of any particular additive is not intended to accordingly restrict its function to its denomination, but merely to indicate its predominant role. For instance, an additive suitable to modify inter alia the viscosity of the composition, may in turn facilitate the dispersion of the particles, hence also serving in a way as a dispersing agent. By way of converse example, an additive formally used as a dispersing agent may additionally modify the rheological properties of the composition or may serve to protect particles from the presence of water.

Plasticizers may not only improve the workability of the transferable (e.g., conductive) composition for the sake of its preparation, application to a transfer membrane and/or transferability to a substrate but may also enhance the mechanical characteristics of the obtained pattern. For instance, the presence of a plasticizer in the composition may render the pattern more flexible and elongatable, than relatively brittle in its absence. Such rheological modifiers can be selected from phthalates, phosphates, glycerides, and esters of higher fatty acids and amides. For example, when needed, such additive can be one or more of the group comprising dibutyl sebacate, butyl stearate, glycol esters of coconut oil fatty acids, butyl ricinoleate, dibutyl phthalate, castor oil, hydrogenated castor oil, hydrogenated microcrystalline wax, hydrogenated resin, hydrocarbon resin, paraffin wax, beeswax, cetyl alcohol, butyl stearate, diethyl phthalate, diphenyl phthalate, dicyclohexyl phthalate, 2-butoxy-2-oxoethyl butyl phthalate, and dioctyl phthalate.

Dispersing agents, which can optionally be added to improve the dispersion of the electrically conductive, otherwise functional or decorative particles in the swelled polymer, and/or of glass frits if present, can be selected from: (a) ether/ester dispersants including, but not limited to, complex mixtures of esters of phosphoric acid and polyethylene glycol ethers of oleyl alcohol, such as, for instance, commercially available Crodafos™ O3A-LQ-(RB) or Crodafos™ O10A; complex mixtures of esters of phosphoric acid and the polyoxypropylene, polyoxyethylene ether of cetyl alcohol, such as Crodafos™ SG; complex mixtures of esters of phosphoric acid and polyethylene glycol ether of tridecyl alcohol, such as Crodafos™ T6A (all foregoing exemplary dispersing agents being supplied by Kroda, UK) or complex mixtures of esters of phosphoric acid and an ester of isotridecyl ethylene glycol, such as Hostaphat® 1306 (Clariant, Switzerland); and (b) anionic dispersants such as Hypermer™ KD4 (Kroda, UK) or Servoxyl® VPTZ 100 (Elementis, UK).

If present, such additives (e.g., rheology modifier, dispersing agent, water-protective agent etc.) can be cumulatively found at at least 0.05 wt. %, at least 0.1 wt. % or at least 0.5 wt. % with respect to the weight of the total composition. In some embodiments, the one or more additives are present at a total weight concentration of at most 30 wt. %, at most 25 wt. %, at most 20 wt. %, at most 15 wt. %, or at most 10 wt. % by weight of the entire transferable composition.

Particles are dispersed or well dispersed in the transferable composition, whether as a result of mixing alone or as a result of the added presence of a dispersing agent, when forming a relatively uniform dissemination of discrete particles within the network of swollen polymer. The relative uniformity of a dispersion of particles can be visually assessed, for instance, by microscopy. While not all particles need be individually dispersed for the composition to be deemed sufficiently homogeneous, and small clusters of a few particles might be tolerated, coarse aggregates are preferably absent. Major aggregates can be detected by the naked eye of a skilled formulator. The presence of such aggregates or the upper size of clusters can also be determined by microscopy, but more readily by using a fineness of grind gauge, also known as a Hegman gauge.

Thermal Expansion

In some cases, it might be desired to heat the transferable composition, the pattern, the flexible membrane and/or the substrate. Heating may, for instance, be applied to lower the viscosity of the composition, facilitate the formation of a pattern, increase the flexibility of the membrane, enhance transfer to a substrate, and/or provide any sought function depending on heat activation. The Coefficient of Linear Thermal Expansion (CTE) of a material is indicative of its tendency to change its shape, area and volume in response to a change in temperature. When two different materials in contact with one another are subjected to a same change in temperature (e.g., heating or cooling), they should preferably have a similar CTE, as too large a difference in their respective CTEs may lead to deleterious deformation of at least one of them, possibly to loss of integrity, or any other effect adverse to their intended use.

The difference in CTEs of materials that may be tolerated depends inter alia on the temperatures to which they are to be jointly subjected, the duration of the heating/cooling, and the intended use of the end-product. In some cases, a minor difference may even be beneficial. For example, if a transferable composition comprises glass frits and conductive particles, as often the case for solar cells, glass frits having a CTE slightly higher than the electrically conductive particles may assist, following heating and cooling of the composition, getting the particles closer to one another, increasing the conductivity such closer contact may achieve. To prevent or reduce possible stress to a relatively fragile silicon wafer, the transferable composition, on the other hand, should preferably have a CTE similar to or mildly lower than this substrate. During the manufacture of solar cells, the firing step, during which the conductive particles are brought to elevated temperatures in order to create electrical contacts on a silicon wafer, any mismatch of thermal expansion coefficients and different mechanical behavior of the materials may cause at least local stress. As a consequence, the wafer may bow and form a convex or concave body upon cooling, and may even cause its fracture, if the mechanical stress resulting from the difference in CTE is too high.

CTEs of the glass frits are generally provided by their manufacturer or can be measured by routine experimentation, such as according to ASTM E228-17. In some embodiments, the glass frits used in the transferable composition of the present invention have a CTE between $50 \times 10^{-7}$ and $120 \times 10^{-7°}$ $C.^{-1}$.

Solar Cell Efficiency

The transferable composition herein described can be used to form a conductive pattern for a variety of electronic products. Considering the particular case of solar cells, the transferable patterns may form either grids of conductive lines, as generally used for a front electrode on the front side of a typical mono-facial solar cell, or may form a conductive layer serving as a back electrode on the rear side of such a solar cell wafer.

While the transferable conductive compositions according to the present teachings can be beneficial to both types of patterns and both sides of a solar cell, it is believed that its contribution to the performance and efficiency of a solar cell might be more important and/or more readily assessable for more continuous electrically conductive patterns, such as desired for a back electrode of a solar cell.

One of the key contributors to the efficiency of a solar cell is a low surface recombination, typically achieved on the front side by the presence of a passivating layer and on the rear side by the formation of a satisfactory Back Surface Field (BSF), which is, simply put, a higher doped region. The electric field formed at the interface between the high and low doped region decreases the dark current and the reflection of minority carriers. The BSF has a net effect of passivating the rear surface, which in turn may increase the open-circuit voltage, $V_{OC}$, and the short-circuit current of the cell. Standard c-Si cells wherein the rear side is not passivated and include a BSF layer over most of its surface are also referred to as BSF cells.

Another type of c-Si solar cells, named Passivated Emitter and Rear Contact (PERC) solar cells, are becoming widely used for their relatively higher efficacy, attributed to the presence of a dielectric passivation layer on their front and back sides. The front side passivation layer can be an anti-reflecting coating, as for more conventional BSF cells, however their rear side passivation layer is perforated either chemically or by laser. This enables contact between a conducting electrode on the back side of the wafer and the silicon layer beneath such perforated passivation layer, creating local BSF under favourable conditions (e.g., after firing). The perforated passivation layer on the rear side of PERC cells has additional contributions allowing PERC cells to have an increased cell efficiency and/or other advantages (e.g., heat resistance) as compared to more conventional cells.

The open circuit voltage ($V_{OC}$) of a solar cell is an indicator for the extent of recombination, a reduced level of recombination translating into an increased $V_{OC}$, indicative of a higher cell efficiency. Though a $V_{OC}$ of 700 mV and more can be observed in laboratory settings and under standard conditions (e.g., at a temperature of 25° C. and a perpendicular illumination of 1,000 watt/square meter), generally, in commercial settings, a $V_{OC}$ of 580 mV or more, 590 mV or more, 600 mV or more, 610 mV or more, 620 mV or more, 630 mV or more, or 640 mV or more, may suffice to consider solar cells, in particular conventional BSF cells, as efficient. For PERC cells, a $V_{OC}$ of at least 660 mV or at least 670 mV can be expected and deemed suitable. The $V_{OC}$ of a cell can be measured by connecting a voltmeter across the terminals of the plus and minus electrodes, when the cell, in absence of load, is producing no current.

While it is believed that swellable polymers may increase the efficiency a transferable conductive composition may provide to a solar cell, first and foremost by reducing the amount of polymers necessary for the workability of the composition, accordingly decreasing the amount of deleterious residues that may remain in an end-product, this may not be the sole advantage of the present compositions. A reduction in the amount of deleterious residues, which could hamper the efficiency of a pattern or solar cell formed with a polymer containing them, is expected to diminish the likelihood of recombination, consequently increasing the $V_{OC}$ a solar cell may develop, and/or facilitate contact formation, thus improving conductivity, especially in PERC cells. Without wishing to be bound by any particular theory, it is further suggested that the use of relatively low amounts of swellable polymer (as compared to relatively higher amounts of more conventional non-swellable binders) may inter alia provide at least one of the following advantages: i) increase the flowability of the transferable composition; ii) facilitate its application to a transfer membrane; iii) enhance its releasability from the membrane; iv) ease its transfer to a substrate; v) enhance contact with the substrate; and vi) augment the potency of electrically conductive particles dispersed therein with respect to one another (e.g., enabling a more uniform sintering, if applied) and/or with respect to the surface of the substrate they would interact with (e.g., facilitating etching by glass frits if present in a pattern due to form a front electrode or promoting the formation of a better BSF by increasing relative doping of the rear surface of a solar cell).

In order to maintain a satisfactory efficiency of the solar cell, the balance between the thickness of the back-electrode layer and the $V_{OC}$ should be maintained. Not to be bound by theory, it is believed that there is a minimal required thickness of the conductive layer on the rear-side of the solar wafer, to allow satisfactory $V_{OC}$ of the wafer and sufficient sheet resistance of the formed electrode. Increasing the conductive layer thickness beyond a certain level would yield no further increase in the $V_{OC}$, thus rendering any further thickness augmentation superfluous. The conductive layer thickness is further detailed below.

Preparation of Transferable Composition

In another aspect of the present invention, there is provided a method for preparing a transferable (e.g., conductive) composition, the composition comprising a swellable polymer, a swelling agent and decorative and/or functional (e.g., electrically conductive) particles. The method is illustrated in FIGS. 1A-1E, FIG. 1F depicting a magnified view of a resulting composition.

In a first step, a polymer premix is prepared, containing a swelled polymer. The polymer swelling is performed by combining a swellable polymer 1 with a swelling agent 2 to obtain a mixture, as illustrated in FIG. 1A. The mixture containing the polymer, which begins to gradually swell 3 (as illustrated in FIG. 1B), is then heated under suitable mixing conditions (e.g., stirring) until complete melting of the polymer, the mixture then forming a uniform gel-like preparation 4 (illustrated in FIG. 1C). The polymer premix can be prepared by heating the mixture to a temperature above the melting temperature of the swellable polymer, the heating temperature being generally at least 20° C. higher, at least 40° C. higher, or at least 60° C. higher than the polymer melting point. While further raising the heating temperature may accelerate the melting of the swellable polymer and the preparation of the polymer premix, this step should preferably be performed under conditions moderate enough to prevent premature elimination of the swelling agent. Thus, the temperature of preparation of the polymer premix is usually at least 40° C. lower, at least 60° C. lower, or at least 80° C. lower than the swelling agent boiling point. Moreover, the mixing vessel can be sealed and/or, if desired, swelling agent can be added during the preparation of the polymer premix to compensate for undesired evaporation or can be provided in excess ab initio. In some embodiments, the polymer premix including the swellable polymer and its swelling agent is heated to a temperature of at least 100° C., at least 120° C., or at least 140° C. In some embodiments, the polymer premix is heated to a temperature of at most 200° C., at most 180° C., or at most 160° C. In particular embodiments, the premix is heated to a temperature within the range of about 100° C. to 200° C., 120° C. to 180° C., or 140° C. to 160° C. The heating can be performed gradually until the premix reaches a desired temperature.

As explained, additives (e.g., rheological modifiers) may optionally be added at this stage to be part of the polymer premix (not depicted in the figures).

The polymer premix so obtained can be cooled or allowed to cool for later use, in which case a reheating step may be required to sufficiently soften the swollen polymer ahead of the addition of the (electrically conductive) particles to the polymer premix. Alternatively, the polymer premix can be used directly after its preparation, wherein the swollen polymer is kept in a soften state. In the present context, the term "directly after" is not intended to necessarily mean immediately after obtaining a uniform polymer premix, since this may occur at a relatively elevated temperature. Such high temperature may not be suitable for some (electrically conductive) particles, as they may trigger undesired reactions. Hence, in some embodiments, the polymer premix temperature is allowed to passively cool down, or is actively reduced, before adding the (electrically conductive) particles. The temperature at which particles can be added for mixing can be considered as a softening temperature of the polymer premix. At this temperature, the polymer premix and a transferable composition prepared therefrom are malleable/flowable enough for the step being performed (e.g., mixing of ingredients, application or deposition onto a membrane, loading within grooves etc.). The flowability of the composition may also depend on the equipment being used, and while the viscosity of the composition need not be particularly limited other than by the ability of a particular equipment to perform the intended step, it is believed that, in some embodiments, the viscosity need not exceed 50,000 mPa·s at the temperature relevant to the assessment of flowability (e.g., at a temperature in the range of 50-100° C.). Such viscosity can be of no more than 40,000 mPa·s, no more than 20,000 mPa·s, or no more than 10,000 mPa·s under the operating conditions of relevance.

When the particles being added do not require particular control of temperature during their mixing with the polymer premix, then such a temperature of mixing can be selected from a wider range between a softening temperature of the polymer premix (or 10-30° C. higher) and the lowest of the boiling temperature of the swelling agent and the maximum processing temperature of the swellable polymer from which at least 40° C., 50° C., 60° C. or 80° C. are subtracted. For illustration, if the softening temperature of the polymer premix is about 50° C., then mixing to disperse the (e.g., electrically conductive) particles within the polymer premix so as to obtain the transferable conductive composition can be performed at a temperature of at least 50° C., at least 60° C., at least 70° C., or at least 80° C. Assuming that the polymer premix consists of a swelling agent having a boiling point of about 320° C. and of a swellable polymer having a maximum processing temperature of 290° C., then the mixing temperature for heat insensitive particles can be of at most 250° C. (290–40), at most 230° C. (290–60), at most 210° C. (290–80), at most 150° C., or at most 100° C. Advantageously, once swollen, the polymer premix can be used at temperatures in a range of 60° C. to 120° C., or 80° C. to 100° C.

Figures 1D, 1E:
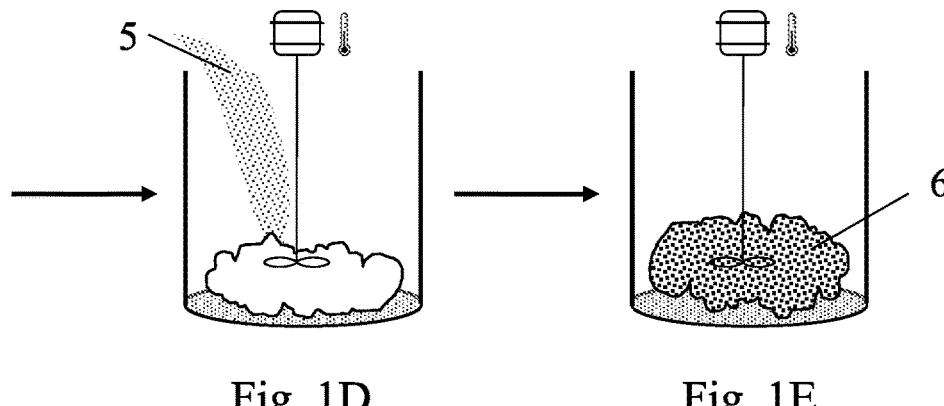
FIG. 1D illustrates the addition of functional and/or
decorative particles to the polymer premix.
FIG. 1E illustrates a transferable composition that may be
obtained at the end of the process.

Whether performed "directly" or not after the first step, in a second step, the polymer premix 4 containing the swelled polymer at a temperature allowing its sufficient softening (e.g., at about 80-90° C.) is combined with particles 5 (e.g., functional electrically conductive or decorative ones), as illustrated in FIG. 1D, and mixed until a homogeneous dispersion of the particles within the gel-like swollen polymer matrix, e.g., a transferable composition 6, is obtained, as illustrated in FIG. 1E.

Figure 1F:
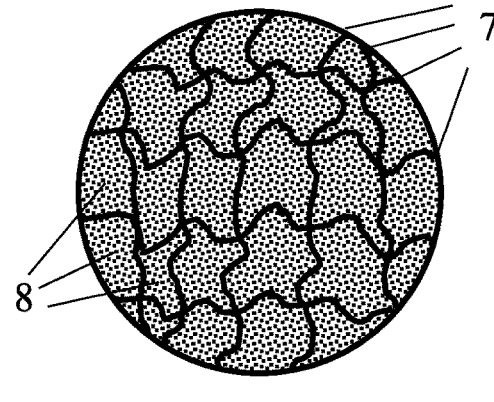
FIG. 1F illustrates a magnified view of a gel-like structure
of a transferable composition.

FIG. 1F schematically shows a magnified view of a transferable composition 6, as may be obtained according to the steps depicted in FIG. 1A to 1E. Without wishing to be bound by theory, it is believed that the swollen polymer forms a matrix of elongated chains 7 which bound inner compartments 8 in which the particles, and any other additives, are dispersed within the swelling agent.

Glass frits and/or at least one dispersing agent (not depicted in the figures) may be added, if desired, at this stage, the addition of such additives (or any other one) being performed at the softening temperature of the polymer premix, so as to facilitate the preparation a homogeneous dispersion within the swollen polymer gel-like structure. The particles so dispersed (and any additive added at any step) constitute, together with the swollen polymer, the transferable composition of the invention. If the particles are electrically conductive, their dispersion in a swollen polymer can be termed a transferable conductive composition.

The (electrically conductive) particles, glass frits, and other potential additives (e.g. rheology modifiers, dispersing agents) can be combined into the composition at various stages. For example, glass frits can be added to the polymer premix, prior to adding the (electrically conductive) particles, to form a glass frits premix. Alternatively, glass frits can be combined with particles (e.g. aluminum), usually in the presence of a dispersing agent, to form a glass frits/particles premix, which is then further combined with the polymer premix. In a further alternative, the (electrically conductive) particles and/or glass frits can be separately combined with a dispersing agent to prepare premixes, which are later combined with the polymer premix.

While processing of the polymer premix and/or the transferable composition can be done by manual mixing, various equipment can be used, typically providing more homogenous mixtures of the swelled polymer. Such equipment include, but is not limited to: vortex, an overhead stirrer, a magnetic stirrer, an ultrasonic disperser, a high shear homogenizer, a planetary centrifugal or a planetary mill, an attritor media grinding mill, a pearl mill, a ball mill, a three-roll mill, an extruder and a press kneader, to name a few. In one embodiment, the preparation of the premix or transferable composition is performed by high shear mixing.

Regardless of the steps used to incorporate the various constituents that may form a particular transferable composition, it is to be noted that the gel-like structure provided by the swollen polymer is essentially retained at the end of the preparation. In other words, a transferable composition according to the present teachings forms a matrix of swollen polymer molecules interacting with one another by strong intermolecular forces and possibly by covalent bonding promoted by certain additives. The spaces within the matrix between the interlocked polymer molecules contain the swelling agent, the dispersed particles, and any other additive that may have been optionally included, as schematically illustrated in the magnified view of FIG. 1F. This entrapment of the particles in a satisfactorily dispersed manner within an internal liquid phase of the gel and their later application to a transfer member, and therefrom to a substrate, in such a state of partial immobilization allows to retain a desired dispersion of the particles once transferred. Without wishing to be bound by theory, the gel-like structure of the present transferable compositions is believed to be advantageous over more conventional compositions comprising similar particles, which may in contrast sufficiently migrate within a continuous, external or separate liquid phase to flocculate or agglomerate in a random manner. By way of example, the transferable composition, by enabling or improving a suitable dispersion of particles in a relatively stabilizing matrix of swollen polymer, may reduce the risk of a pattern being formed with discontinuities in terms of particles presence. Considering conductive patterns for illustration, sections of a pattern insufficiently loaded in particles, e.g., gaps therebetween preventing sintering, may result in disconnection of a conductive pattern or in reduction of its efficacy.

The rheology of the transferable (conductive) composition so obtained generally depends on two main parameters: i) the temperature, its increase causing a decrease in the viscosity; and ii) the shear-thinning behavior of the composition, if any.

The shear-thinning or pseudoplastic flow behavior of a composition, characterized by a decrease in viscosity with increasing shear rates, is generally attributed to the structural reorganization of the polymer molecules within the composition upon application of shear. Without wishing to be bound by any particular theory, it is believed that the polymer chains disentangle when subjected to shear and align in such a manner that induces the viscosity decrease. Upon cessation of the shear, the composition reverts to its former condition, viscosity increases back, and the composition may even regain its original higher viscosity. Such a behavior can be desired when the application of the transferable composition to the transfer membrane involves shearing by the applicator or process being employed for this purpose.

If, for instance, the transferable composition is applied by screen printing or a doctor blade, it is advantageous to have at first a composition with a relatively higher initial viscosity (e.g., to prevent inadvertent flow ahead of intended selective application) which can subsequently display a relatively lower viscosity during application under shear (e.g., allowing the composition to flow through the mesh of a screen print), but then thicken back once applied on the transfer membrane (e.g., allowing the pattern to retain its intended shape).

In such embodiments, the transferable compositions of the present invention demonstrate a decrease in the compositions' viscosity of at least one order of magnitude at a shear rate of at least 150 s$^{-1}$. The viscosity can be assessed using any suitable rheometer, such as Thermo Scientific MARS III, operated with a circular plate having a diameter of 60 mm, at a shear rate vs. shear stress from 0-1000 s$^{-1}$ (rotation ramp) and a measuring spindle geometry of 60/1° TiL. Measurements should be made at a temperature of relevance to the temperature of application of the transferable composition, and the present observations of thinning behavior were made at 80° C.

Application of the Transferable Composition

The transferable (conductive) composition obtained by way of non-limiting example by the method described above can then be applied onto a transfer membrane by any suitable method known in the art. For instance, the composition can be deposited on the membrane and spread to yield a coating of desired shape and thickness upon the surface of the membrane, such as by wiping the deposited composition with a squeegee, a doctor blade or an air knife, or any such device adapted to level a composition with or without contact therewith. Alternatively, a pattern having a specific design (e.g., a grid-like shape of spaced lines of conductive particles) can be applied by screen printing or any other method allowing the selective deposition of a composition in a predetermined pattern. Patterns can additionally be formed within grooves formed below the surface of the transfer membrane, similarly in principle to intaglio printing. For instance, grooves may be formed by a laser, its heat selectively engraving a plastic membrane to form a desired pattern. Grooves may also be formed by mechanical engraving, by contacting the membrane with a suitably shaped die (optionally with a counter die) the die being adapted to form at least part of the desired pattern. For illustration, a suitably shaped die could be a shim having parallel projections having a contour and a spacing corresponding to the profile of the grooves to be correspondingly formed at a similar distance from one another. The shim can be mounted on a plate or on a cylinder and pressure applied to form the grooves. The composition can then be deposited on the membrane and wiped to fill in the grooves, such loading being performed in one or more cycles until the composition substantially level with the surface of the membrane. Such a process was described by the Applicant in WO 2018/020479 and WO 2018/020481. The transferable pattern is said to constitute at least part of a pattern desired on a substrate, since such desired patterns may be complex and/or separately applied, optionally by different methods. For instance, considering a front electrode of a solar cell for illustration, the transferable pattern may form a grid-like array of electrically conductive fingers, transversal bus bars being separately applied to the substrate.

The application of the transferable composition onto the transfer membrane can be conducted at one or more temperatures sufficiently elevated with respect to ambient temperature to facilitate deposition of the composition and formation of the pattern by the device selected for this purpose. Such a temperature is selected to be high enough to allow sufficient flowability of the composition for its application on the membrane, while being low enough to prevent such flowability to extend beyond the formation of the desired pattern. As readily appreciated by the skilled persons, such temperatures may depend on the application device and/or on the application method, on the pattern to be formed and the duration of its formation, and on the membrane onto which the composition is to be applied. It may also depend on the composition, its softening temperature, the need to load it within grooves or to apply it upon the surface of the membrane and like considerations.

In some embodiments, the application temperature is in the range of 50° C. to 150° C., 60° C. to 120° C., or 70° C. to 100° C. The application temperature can be, for instance, at least 50° C., at least 60° C., at least 70° C., or at least 80° C. In some embodiments, the temperature of application of the transferable conductive composition onto the membrane is at most 150° C., at most 120° C., at most 100° C., at most 95° C., or at most 90° C. This temperature may relate to the temperature of the composition upon its feeding to an applicator or upon its deposition onto the membrane, and it may subsequently decrease by the time the pattern is formed. In some embodiments, the application temperature is maintained essentially constant for the duration of the application or its decrease is slowed down, for instance by applying heat to the membrane upon which the composition is being applied. Depending on the process being elected for the application of the composition to a transfer membrane, the temperatures applied or experienced, and the period of time the composition might be subjected to such temperatures, at least part of the swelling agent may be eliminated during the application process. If desired, additional removal of swelling agent can be achieved following the formation of the pattern on the membrane (e.g., by hot air flow). However, it is not necessary to eliminate all presence of swelling agent, as long as the pattern formed on the membrane is sufficiently "dry" to maintain its desired shape and/or non-tacky for subsequent steps. On the contrary, it is believed that presence of at least part of the swelling agent (e.g., 10 vol. % or more, by volume of the composition on the membrane) is desired for the polymer to remain swollen, as this may facilitate later transfer.

If desired, a diluent can be added to the transferable composition to facilitate its application to a transfer membrane. The diluent may serve to provide a viscosity adapted to the application method or device, any suitable one being alternatively referred to as an applicator. As the role of the diluent is transient, it can preferably be rapidly eliminated. A diluent can for instance be a short chain alcohol having a relatively low boiling point, such as isopropanol by way of non-limiting example.

The applied pattern can have any desired thickness depending on the intended purpose. If the thickness is measured following application of the transferable composition before any significant modification of its contents takes place (e.g., before evaporation of relatively volatile components), then such thickness values are said to refer to the "wet" thickness of the pattern. Following application on a transfer membrane, a transferable pattern may have a wet thickness of at least 3 µm, at least 5 µm, or at least at least 10 µm. In some embodiments, the transferable pattern may have a wet thickness of at most 250 µm, at most 200 µm, at most 150 µm, at most 100 µm, or at most 80 µm. For solar cells back electrodes, the wet thickness of the pattern of transferable composition can be in a range between 25 µm and 50 µm.

If the measurements are made following elimination of at least part of the swelling agent, and typically following intentional drying of the pattern, then such values are said to refer to the "dry" thickness of the pattern. A transferable pattern may have a dry thickness of at least 2 µm, at least 3 µm, or at least 5 µm. In some embodiments, the transferable pattern may have a dry thickness of at most 200 µm, at most 170 µm, at most 130 µm, at most 90 µm, or at most 70 µm.

Transfer Membranes

Once applied, the transferable composition of the present invention should preferably have a relatively low adhesion to the membrane (e.g., only sufficient for the composition, regardless of remaining amount of swelling agent, to remain attached to its surface and/or within grooves during manufacturing, handling, or storage, and upon application to a substrate, but to be releasable from the membrane, if it is to be peeled off from the substrate after lamination thereto). On the other hand, the composition should preferably have a relatively high adhesion to the receiving substrate (e.g., allowing for the transfer of the pattern, including for instance electrically conductive particles, to the substrate).

A transfer membrane can suitably be selected to facilitate this relative low adhesion/high releasability of the transferable composition.

While transfer membranes could be rigid ones, such as the outer surface of an impression cylinder, flexible membranes are deemed advantageous for a subsequent transfer of a pattern formed thereon, such as feasible using an apparatus as described by the Applicant in WO 2018/020483. Advantageously, but not necessarily, the flexible membranes, if to be peeled away from the substrates following transfer, can be disposable. In one embodiment, the flexible membranes have a web form and can be used in a roll-to-roll process.

Flexible membranes with low surface energy can be used in the method disclosed herein, membranes including thermoplastic polymers selected from cyclic olefin copolymer (COC), polyvinyl chloride (PVC), polypropylene (PP), polyethylene (PE), thermoplastic polyurethane (TPU) and polyethylene terephthalate (PET) being particularly suitable when the pattern of transferable conductive composition is to be formed within grooves below the surface of the transfer membrane.

Foils made of such thermoplastic polymers may also be used when the pattern of transferable conductive composition is to be formed upon the surface of the transfer membrane, but in this case other plastic polymers, not necessarily thermoplastic, can also be used. As no engraving is expected from such supports of the transferable patterns, additional materials may serve for these transfer membranes, which may for instance be foils of metal or paper, typically combined by lamination with a layer of plastic polymer. Transfer membranes suitable for a pattern to remain on its outer surface are substantially impermeable to the composition applied thereon, to prevent any undue penetration that would negatively affect the shape of the intended pattern or its ability to later transfer. The material constituting such transfer membranes, or an outer layer thereof, can be impermeable by itself, or the transfer membrane can be pretreated with an impermeabilizing agent.

Flexible membranes made from such polymers are preferably sufficiently non-elastic to maintain the shape of patterns to be formed thereupon or within grooves therein and the contour of the compositions applied thereto. On the other hand, the membranes are preferably flexible enough to conform to the surface of a subsequent substrate (e.g., a solar wafer), so as to permit a sufficiently intimate contact for transfer of the pattern formed by the transferable composition. A membrane having a relatively smooth surface can be desired for similar reasons of improving interfacing during the process (e.g., with a squeegee filling the grooves, with the substrate, etc.). Advantageously the mean roughness Rz of the surface of the flexible membrane due to contact the substrate is of 1 μm or less, 500 nm or less, 250 nm or less, or 100 nm or less. Other desirable mechanical properties can be readily understood, so as to render the membranes compatible with the method (e.g., stretch resistant, stress resistant, heat resistant, radiation resistant, and the like) and with the compositions used therein (e.g., chemically resistant, chemically inert, etc.)

While in some embodiments, the flexible membrane may be pre-formed and provided as such (e.g., in rolls or sheets), the flexible membrane may alternatively be cast from suitable materials (e.g., thermoplastic polymers that solidify upon cooling, or photopolymers that cure upon exposure to radiation, which can be referred herein as plastics polymers) to form a membrane as part of the process. Formable plastics polymers that can be embossed or cast are known to the skilled persons.

Pattern Transfer

The pattern formed on the transfer membrane using a transferable composition according to the present teachings can be transferred onto a suitable substrate, or a side thereof depending on the pattern. The transfer of the pattern, advantageously from a flexible membrane to the substrate, is typically performed upon application of pressure (e.g., in the range of from about 0.1 kgF/cm$^2$ to about 50 kgF/cm$^2$) and optionally at elevated temperatures. The rationale for performing transfer at a temperature higher than ambient one is similar to previously detailed with respect to the application of the transferable composition to the membrane. Briefly, as a higher temperature may decrease the viscosity and increase the malleability of the composition forming the pattern, improved wetting of the receiving substrate can be achieved, which may in turn facilitates the transfer and adhesion to the substrate. Such transfer temperature may promote release of the pattern from the transfer membrane and/or facilitate its adhesion to the substrate Such temperature of transfer may depend on the transferable composition, on its softening temperature, on the membrane carrying the pattern, and on the substrate to be contacted therewith. The transfer temperature may further depend on the pressure being applied at the line or area of contact between the transfer membrane and the substrate. The transfer temperature can be, for instance, at least 80° C., at least 90° C., or at least 100° C. In some embodiments, the transfer temperature is at most 150° C., or at most 140° C. In some embodiments, the transfer temperature in the range of 80° C. to 150° C., 100° C. to 150° C., or 130° C. to 140° C.

In some embodiments, the transfer temperatures are achieved by jointly heating the substrate and the membrane, for instance by contacting them between two rollers, at least one of the cylinders being heated to a temperature allowing their rapid attaining of the desired transfer temperature. In other embodiments, the transfer temperatures are achieved by heating solely the substrate, while the membrane remains or is maintained at ambient temperature. The substrate can be heated by any suitable method, such as by conduction (e.g., passing over a hot plate), by convection (e.g., using a hot air flow), by radiation (e.g., using an IR lamp) or by combination of such heating means.

In some embodiments, the temperature is decreased after pressure is applied to effect proper contact and before the membrane is, if desired, peeled away to effect transfer of the pattern to the substrate. At this intermediate stage, the membrane is said to be "substrate attached" or the substrate "membrane attached", even though this attachment can be temporary until separation takes place, when desired. The cooling can be actively effected by conduction (e.g., passing the substrate attached membrane over a cold surface), by convection (e.g., blowing air optionally cooled towards the substrate attached membrane) or by combination of such cooling means. If separation is not required, or not immediately required, cooling can be passive.

Substrate

The substrate is selected and adapted to the intended use of the pattern transferred thereto, such selection being known to the skilled person. When used in the production of solar cells, the substrate may be a semiconductor wafer. The substrate can be rigid or flexible, made-up of one or more layers of materials, serve for transfer on one or more of its sides, can be doped or undoped, and the like. By way of non-limiting example, a substrate suitable for the preparation of a solar cell can be a rigid wafer or a flexible film. The substrate may be a face of a solar cell made of inorganic materials, such as mono or multi-crystalline silicon (mono c-Si or multi c-Si), amorphous silicon (a-Si), gallium arsenide (GaAs), poly-silicon (p-Si), and any other like substrate used in solar cells, or of organic materials, such as flexible polymers. Such wafers may assume a variety of sizes (e.g., approximately 156×156 mm or 125×125 mm) and thicknesses (e.g., in the range of 150-300 μm or 100-250 μm).

A semiconductor solar substrate may have a patterned surface, the surface forming, for instance, an array of pyramid-like protrusions.

When used in non-solar technologies, other substrates can be used, which can be generally referred to as insulating substrates. These insulating substrates can be rigid or flexible, made-up of one or more layers of materials. By way of non-limiting example, a substrate suitable for the preparation of a circuit board can be a rigid wafer or a flexible film. The insulating substrate may be made of or only have a surface made of a phenolic resin, a ceramic, an epoxy resin, a glass, a plastics material or any other electrically non-conductive material. By way of example, the substrate of a PCB can be a rigid board of fiberglass (e.g., FR4) or a flexible high-temperature plastic (e.g., a Kapton® polyimide film as available from DuPont Corporation), also referred to as a flex board.

In some embodiments, the insulating substrate can be a substrate of any material having an outer insulating surface formed of a thin layer of electrically insulating material. Such insulating layers, which can have a thickness of a few tens of nanometers up to a few hundreds of micrometers (e.g., in the range of 50 nm to 100 μm) can be applied by any suitable method known to the skilled person, such as spin coating, dip coating or vapor deposition on the substrate body underlayer. By way of non-limiting example, the thin film forming the insulating surface of an electrically insulating substrate can be made of (a) photopolymers derived from B-staged bisbenzocyclobutene (BCB), (e.g., as commercially available from The Dow Chemical Company under the Cyclotene™ 4000 Series), (b) SU-8 epoxy-based negative photoresist, or (c) poly(p-xylylene) polymers (also known as Parylenes). Such insulating thin layers can, for instance, be applied on substrates having an underlying body made of metals or ceramics.

Sintering

When used for the manufacturing of solar cells or other electrically conductive circuits, the transferable composition, the pattern formed thereby on a transfer membrane, and the pattern transferred therefrom to a substrate may include electrically conductive particles optionally requiring sintering to render the pattern electrically conductive. Depending on the materials the particles are made from, various sintering methods can be considered. Typically, for metals, thermal sintering is the method of choice. The sintering temperature can be additionally selected to eliminate essentially all former organic constituents of composition (e.g., swellable polymer, swelling agent, etc.) the conductive line resulting from the sintering process being primarily formed by the sintered electrically conductive particles.

When the transferable composition further comprises glass frits, and subsequent to the composition within the transferred pattern being, if needed, sintered, the substrate and the pattern transferred thereto may be fired to cause the conductors to fuse with the substrate. The molten glass can etch the dielectric layer on the front side of the semiconductor wafer, while allowing metal ions (e.g., silver) to migrate through it to the substrate (e.g., a silicon wafer or thin-film), producing a conductive path between the surface metal pattern and the wafer underneath the dielectric or passivation layer, if one exists.

When used in transferable compositions applied on the rear side of a solar cell wafer (either BSF or PERC), the molten glass frits may coat the conductive particles during sintering, facilitating their migration towards the silicon layer, thus enabling the contact between the particles and the silicon, and consequentially, the BSF (or local BSF for PERC cells) formed thereby. The sintering can also improve the sheet resistance, as demonstrated by the cell conductivity. Not to be bound by theory, it is believed that upon cooling of the molten glass frits following sintering, the sintered composition may undergo some shrinkage, which may in turn lead the particles to get closer one to another, thus increasing conductivity.

Such firing may be carried out separately, or merely as an extension of the step utilized to sinter the electrically conductive particles, when needed. The temperatures and times required for the fusing of the conductors to a semiconductor substrate are however different from those needed for mere thermal sintering. For instance, sintering of the electrically conductive particles may be carried out at a sintering temperature in the range of from about 100-150° C. to about 800° C., whereas firing through the composition pattern so as to form electrical contact with the substrate can be performed at a firing temperature in the range of from about 500° C. to about 900° C., the firing temperature being greater than the sintering temperature.

Such post-treatment of the pattern once applied to the substrate is typically performed according to a ramping up profile of temperatures, as known to a person skilled in the art of solar cell manufacturing. A first phase (e.g., at 200° C.-250° C.) may allow substantial drying of any component volatile at the selected first phase temperature, a second phase (e.g., at 500° C.-550° C.) may ensure the polymer is eliminated by burning while the particles undergo at least part of their sintering, and a third phase (e.g., at 680° C., 790° C., 860° C. and/or 920° C.) may ensure progressive firing of the electrically conductive particles to the solar cell substrate.

Depending on the pattern and on the side of a solar substrate it would be applied to, the transferable conductive composition of the present invention can be used to ultimately prepare an electrically conductive pattern for a front surface of a solar cell (i.e. a front electrode) or an electrically conductive coating on a back side of a solar cell (i.e. a back-electrode).

Thus, in a further aspect of the invention there is provided a transferable composition and a pattern formed thereby, that can be applied to a transfer membrane and subsequently released therefrom to a substrate. In a particular aspect of the invention, the transferable composition yields electrically conductive patterns which can be used for the manufacturing of solar cells.

Furthermore, in an additional aspect, there is provided a solar cell manufactured with a transferable composition according to the present teachings and/or with a transfer membrane carrying patterns prepared therewith.

Following transfer and any desired post-transfer treatment (e.g., sintering, firing, etc.), the electrically conductive pattern may have a thickness of at least 2 μm, at least 3 μm, or at least 5 μm. In some embodiments, the pattern may have a thickness of at most 200 μm, at most 170 μm, or at most 130 μm. Thickness of a pattern, or of a conductor thereof, can be measured by FIB microscopy or by a thickness meter, comparing the thickness of the transfer membrane in areas with and without pattern.

Alternatively, the transferred patterns may not need sintering and/or firing to become electrically conductive, the transferable compositions serving to form them including particles that are intrinsically electrically conductive. Furthermore, the particles may be inherently functional and/or decorative without requiring any particular treatment following transfer. In such cases, readily usable end-products may be obtained following transfer of the patterns including such "ready to use" particles.

EXAMPLES

Materials

The materials used in the following examples are listed in Table 1 below. The reported properties were retrieved from the product data sheets provided by the respective suppliers or estimated by standard methods. Unless otherwise stated, all materials were purchased at highest available purity level. N/A means that a particular information is not available.

TABLE 1

| Component | Name | Product Name | Supplier | CAS No. |
|---|---|---|---|---|
| Swellable polymers | Anhydride modified EVA polymer | Bynel ® 3861 | Dupont, USA | N/A |
| | Acid-/acrylate-modified EVA polymer | Bynel ® 3101 | | |
| | EVA copolymer | Elvax ™ 670 Elvax ™ 470 Elvax ™ 410 Elvax ™ 420 Elvax ™ 350 | | |
| | Ethylene/acrylic ester/maleic anhydride ter-polymer | Lotader ® 4700 | Arkema, France | |
| | Ester-terminated polyamide | CrystaSense ™ LP1 | Croda, UK | |
| Swelling agent (solvent) | $C_{13-14}$ Isoparaffin | Isopar ™ M | Exxon Mobil Corp, USA | 64742-47-8 |
| Solid particles | Aluminum powder (1-2 μm, 3-4 μm, 5-6 μm, 9-10 μm) | Spherical Aluminum Powder | Hunan Jinhao New Material Technology Co., China | 7429-90-5 |
| | Aluminum-Silicon alloy (Al-Si 1-2 μm) | Aluminum-Silicon Alloy Powder (Al: 87-89% Si: 11-13%) | Skyspring Nanomaterials, Inc., USA | Al: 7429-90-5 Si: 7440-21-3 |
| | Silver powder (1-3 μm) | Silpowder ® 574 | Technic Inc., USA | 7440-22-4 |
| Glass frits and components therefor | $SiO_2$—$SrO$—$Bi_2O_3$—$B_2O_3$—$Al_2O_3$ | Glass frit V2083 | 3M ™, USA | N/A |
| | $Bi_2O_3$—$SiO_2$—$B_2O_3$ | ASF-1100B | AGC Electronics Co., Ltd, Japan | N/A |
| | PbO | Lead oxide | Sigma-Aldrich | 1317-36-8 |
| | $B_2O_3$ | Boron oxide | Corporation, USA | 77704-22-4 |
| | ZnO | Zinc oxide | Changsha Easchem Co., China | 1314-13-2 |
| | $SiO_2$ | Silicon dioxide | Sinosi Sci-Tech., China | 60676-86-0 |
| Dispersing agents | Octyl phosphate ester | Servoxyl ® VPTZ 100 | Elementis, UK | N/A |
| | Polyoxyethylene (10) ether phosphate | Crodafos ™ O10A | Croda UK | 39464-69-2 |
| | Ethoxylated oleyl ether acid phosphate | Crodafos ™ O3A-LQ-(RB) | | 39464-69-2 |
| | Polymeric ester of isotridecyl ethylene glycol and phosphoric acid | Hostaphat ® 1306 | Clariant, Switzerland | 73038-25-2 |
| | Phosphoric acid isotridecyl esters | Hordaphos ® ITD | | 52933-07-0 |

TABLE 1-continued

| Component | Name | Product Name | Supplier | CAS No. |
|---|---|---|---|---|
| Rheological modifiers | Castor oil derivative (hydrogenated) | Castor wax HCO 70 | Strahl & Pitsch Inc., USA | 8001-78-3 |
| | Hydrogenated Microcrystalline Wax | Microcrystalline Wax 180/185 or Permulgin 4211 | Koster Keunen, USA | 64742-60-5 |
| | Hydrogenated Resin | Foral ™ AX-E | Eastman, USA | 65997-06-0 |
| | Hydrocarbon Resin | Kristalex F85 | | 9011-11-4 |
| Misc. | Ethylcellulose | Ethocel ™ 100 | Dow Chemical, USA | 9004-57-3 |

Equipment

Ball mill: YKQ-2-5L, by Changsha Yonglekang Equipment Co., China

Drying oven: by Biobase, China

Flat Screen Printer: AT-60P, by ATMA, Taiwan 4-terminal resistance meter: DT-5302, CEM, China Heating mantle: by Huanghua Faithful Instrument Co., China High shear homogenizer: HOG-500-2, by Dragon Labs, China I-V tester including a Kepco BOP 20-20 bipolar power supply, a 2. Keithley 2700 multimeter capable of reading current and voltage, a temperature-controlled chuck, and an EYE SolarLux 150R 400 nm-1100 nm light source as solar simulator I-V tester: Suns $V_{OC}$, by Sinton Instruments, USA IR heater: Infrared hanging oven bath 3 degrees 1500 W, by Electro Hanan, Israel Laminator: LM-380, by Epoch International, USA Rubber roller having a diameter of 3 cm, a total length of 15 cm, an outer surface having hardness of 80 Shore A, and an overall weight of 102 g Solar belt furnace: CDF-SL7210, by Despatch Industries, USA Vacuum automatic film applicator: BDG 218, by Biuged Laboratory Instruments (Guangzhou) Co., China

Example 1: Preparation of a Transferable Composition—Testing of Various Swellable Polymers 1.1 Preparation of Swelled Polymer Premixes 400 g of Isopar™ M, serving as swelling agent, were placed in a 500 ml closed glass reaction vessel, equipped with a condenser to prevent or reduce solvent evaporation. 100 g of a swellable polymer as listed in Table 2 and Castor wax HCO 70 (serving as rheological modifier) at a weight per weight ratio of 3:1 (75 g and 25 g, respectively) were added to the swelling agent, and the obtained mixture was heated, using a heating mantle, to about 150-160° C., while stirring with a standard overhead stirrer at about 800-2,000 rpm, until a clear solution was obtained. The solution was transferred to a sealable glass container and maintained in the sealed container at room temperature (circa 23° C.) for at least 2 hours, allowing the premix of swollen polymer to cool down, whereby a whitish, dense, rubber-like composition was obtained, containing 15 wt. % of the swellable polymer by weight of the polymer premix.

The swellable polymers that were used for the preparation of polymer premixes according to the above method are listed in Table 2, as well as their Melt Flow Rates as supplied by their respective suppliers for a load of 2.16 kg at 190° C. Their respective melting temperatures, softening temperatures and densities are provided as well.

TABLE 2

| Swellable polymer | MFR [g/10 min] | Melting Tm [° C.] | Softening Ts [° C.] | Density [g/ml] |
|---|---|---|---|---|
| Bynel ® 3101 | 3.2 | 87 | 65 | 0.94 |
| Bynel ® 3861 | 2.0 | 80 | 56 | 0.95 |
| CrystaSense ™ LP1 | 35 | N/A | 92 | 0.99 |
| Elvax ™ 350 | 19 | 74 | 46 | 0.95 |
| Elvax ™ 410 | 500 | 73 | N/A | 0.93 |
| Elvax ™ 420 | 150 | 73 | N/A | 0.94 |
| Elvax ™ 470 | 0.7 | 89 | 68 | 0.94 |
| Elvax ™ 670 | 0.35 | 95 | 79 | 0.94 |
| Lotader ® 4700 | 7.0 | 65 | <40 | 0.94 |

1.2. Preparation of a Conductive Composition 59.2 g of a polymer premix (of which 8.88 g are the swellable polymer) prepared in the previous step was placed in a 250 ml glass container. The gel-like swollen polymer composition was heated, using a heating mantle, to about 80-90° C., until sufficiently uniformly flowable to incorporate solid particles. 3.4 g of glass frits (V2083, having a density of 5.6 g/ml) were gradually added into the softened polymer premix compositions, while stirring, using an overhead stirrer at about 800-2,300 rpm, and then maintained under continued stirring for 5 more minutes until a homogeneous dispersion was obtained.

The electrically conductive particles were prepared by combining two types of aluminum powders (having a density of 2.7 g/ml) at a weight per weight ratio of 2:1, larger particles predominating in the present example. Namely, 88.4 g of aluminum particles having an average diameter of 5-6 μm and 44.2 g of aluminum particles having an average diameter of 1-2 μm were gradually incorporated under continuing stirring in the polymer premix already supplemented with glass frits, and the resulting mixture was stirred for 5 more minutes until a homogeneous dispersion was obtained. Since the gradual addition of solid particles allowed for some decrease in the amount of swelling agent, 4.8 g of Isopar™ M were added during this process to improve flowability of the mixture and dispersion of particles therein. The dispersions of electrically conductive particles in each of the swollen polymers obtained by this method were maintained in closed glass containers at room temperature for 2-3 hours, allowing them to cool down, forming then a grey paste.

The volume of each component was calculated by dividing its weight by its density, then the vol. % of each component was calculated by dividing its volume by the volume of all solids (the swellable polymer, glass frits and aluminum), the result being multiplied by a hundred. An exemplary calculation is provided in Table 3 for the swellable polymer Bynel® 3861.

TABLE 3

| Component | Weight [g] | Density [g/ml] | Volume [ml] | % v/v solids |
|---|---|---|---|---|
| Bynel ® 3861 | 8.88 | 0.95 | 9.35 | 15.82 |
| Glass frits | 3.4 | 5.33 | 0.64 | 1.3 (*) |
| Aluminum | 132.6 | 2.7 | 49.11 | 83.1 |
| Total Volume of Solids | | | 59.1 | |

(*) The volume percent of glass frits is calculated with respect to the volume of aluminum

TABLE 4

| Component | Product Name | Ex. 2.1.1 Wt. % | Ex. 2.1.2 Wt. % | Ex. 2.1.3 Wt. % |
|---|---|---|---|---|
| Swellable polymer | Bynel ® 3861 | 18 | 18 | 20 |
| Swelling agent | Isopar ™ M | 76 | 79 | 74 |
| Rheology modifiers | Castor wax HCO 70 Microcrystalline Wax 180/185 or Permulgin 4211 | 6 | 3 | 6 |
| Total | | 100 | 100 | 100 |

2.2. Preparation of Conductive Compositions Containing Aluminum Powders

Transferable compositions, containing the Bynel® 3861 polymer premixes, were prepared according to Example 1.2, differing in various components and quantities, as summarized in Table 5. The vol. % of each component, by solid volume, was calculated as specified in Example 1.2 (calculation not presented).

TABLE 5

| Product Name/ specifics | Ex. 2.2.1 Wt. [g] | Ex. 2.2.1 % v/v solids | Ex. 2.2.2 Wt. [g] | Ex. 2.2.2 % v/v solids | Ex. 2.2.3 Wt. [g] | Ex. 2.2.3 % v/v solids | Ex. 2.2.4 Wt. [g] | Ex. 2.2.4 % v/v solids | Ex. 2.2.5 Wt. [g] | Ex. 2.2.5 % v/v solids |
|---|---|---|---|---|---|---|---|---|---|---|
| Bynel ® 3861 premix (Ex. 2.1.1) | 160 | 19.8 | | | | | | | | |
| Bynel ® 3861 premix (Ex. 2.1.2) | | | 64 | 19.6 | 64 | 19.6 | 62 | 19.1 | | |
| Bynel ® 3861 premix (Ex. 2.1.3) | | | | | | | | | 31 | 20.8 |
| Glass frits V2083 (density: 5.33 g/ml) | 15.5 | 2.4 (*) | 1.7 | 1.2 (*) | 1.7 | 1.2 (*) | 1.7 | 1.2 (*) | 0.85 | 1.2 (*) |
| Glass frits ASF-1100B (density: 6.3 g/ml) | | | 1.7 | | 1.7 | | 1.7 | | 0.85 | |
| Al powder (5-6 μm) | 216.5 | 78.3 | 88.4 | 79.4 | 112.6 | 79.4 | 112.6 | 79.4 | 56.3 | 78.3 |
| Al powder (1-2 μm) | 108 | 44.2 | | | | | | | | |
| Al—Si alloy powder (1-2 μm) | | | | | 20 | | 20 | | 10 | |
| Foral Ax-E | | | | | | | 2 | | | |
| Kristalex F85 | | | | | | | 1 | | | |
| Isopar ™ M | | | | | | | | | 1 | |

(*) Glass frits concentration is provided as % volume per volume of the Al powder or of the mixture of Al powder and Al—Si alloy powder

Example 2: Preparation of Transferable Compositions—Testing of Various Premixes and Formulations of a Same Swellable Polymer

2.1 Preparation of Bynel® 3861 Premixes

Premixes containing 18 wt. % Bynel® 3861 as well as Isopar™ M and rheological modifiers were prepared according to Example 1.1 and are summarized in Table 4.

Example 3: Alternative Methods of Preparation of Transferable Compositions

3.1. Supplying of Swelled Bynel® 3861 Premixes

Bynel® 3861 polymer premix was prepared according to Example 1.1, wherein the polymer was swelled by Isopar™ M in the absence of Castor wax HCO 70, to yield a premix having a polymer content of 26 wt. %.

The Bynel® 3861 polymer premix was placed in a glass container and heated, using a heating mantle, to about 80-90° C., until sufficiently uniformly flowable to incorporate solid particles. The heated premix was maintained at this temperature until further use.

Similarly, a Bynel® 3861 polymer premix having a polymer content of 25 wt. % was prepared.

3.2. Preparation of Transferable Compositions Using an Aluminum/Glass Fits Premix In a separate 300 ml glass container, 10.8 g of Isopar™ M and 0.5 g of Crodafos™ O10A were placed and mixed by an overhead stirrer, followed by a gradual addition of 2.2 gr of glass frits (first 1.1 g of V2083 and then 1.1 g of ASF-1100B). Aluminum powders were then gradually added to the former blend under continuing stirring, first 28.8 g of a powder having an average size of 1-2 μm, and then 57.7 g of a powder having an average size of 5-6 μm. Once the aluminium powders were sufficiently combined with the blend comprising the glass frits, the resulting combination was further mixed using a high shear homogenizer at 20,000 rpm for 1-2 minutes to obtain an Aluminum/glass frits premix I.

In a similar manner, Aluminum/glass frits premixes II and III (wherein aluminum powders of various sizes were used) were prepared according to Table 6. The data is provided in wt. %.

TABLE 6

| Component | Aluminum/glass frits premix I | Aluminum/glass frits premix II | Aluminum/glass frits premix III |
|---|---|---|---|
| Isopar ™ M | 10.8 | 12.2 | 12.3 |
| Hordaphos ® ITD | 0.5 | 0.5 | 0.5 |
| Glass frits containing lead oxide, zinc oxide, boron oxide and silicon dioxide | 2.2 | 1.5 | 2.25 |
| Aluminum powders: 1-2 μm | 28.8 | 4.3 | 4.25 |
| 3-4 μm | | 34.3 | 34 |
| 5-6 μm | 57.7 | 34.3 | 34 |
| 9-10 μm | | 12.9 | 12.7 |

22.5 g of the heated Bynel® 3861 polymer premix (of 26 wt. % polymer content) prepared according to Example 3.1 were then placed in another 300 ml glass container, and 77.5 g of the Aluminum/glass frits premix I were added. The container was placed in a heating mantle at about 80-90° C., and its contents were mixed with an overhead stirrer at about 800-2,300 rpm until sufficiently uniformly flowable, followed by further mixing using a high shear homogenizer at 20,000 rpm for 1-2 minutes to obtain the Transferable conductive composition I.

Similarly, Transferable conductive composition II was prepared by combining the Aluminum/glass frits premix II with 21.4 wt. % of the Bynel® 3861 polymer premix (of 25 wt. % polymer content), and heat stirring, but without further mixing by high shear homogenization.

Transferable conductive composition III was similarly prepared, by combining the Aluminum/glass frits premix III with 20.6 wt. % of the Bynel® 3861 polymer premix (of 25 wt. % polymer content), and heat stirring, without further mixing by high shear homogenization.

3.3. Preparation of a Transferable Composition Using an Aluminum Premix

In a separate 300 ml glass container, 13.4 g of Isopar™ M and 0.6 g of Crodafos™ O3A-LQ-(RB) were placed and mixed by an overhead stirrer. Aluminum powders were then gradually added under continuing stirring, first 28.7 g of a powder having an average size of 1-2 μm powder, and then 57.3 g of a powder having an average size of 5-6 μm, followed by mixing using a high shear homogenizer at 20,000 rpm for 1-2 minutes to obtain an aluminum premix.

22.5 g of the heated Bynel® 3861 polymer premix (of 26 wt. % polymer content) prepared according to Example 3.1 were then placed in another 300 ml glass container, and 1.8 g of glass frits were gradually added (first 0.9 g of V2083 and then 0.9 g of ASF-1100B). The container was placed in a heating mantle at about 80-90° C., and its contents were mixed with an overhead stirrer at about 800-2,300 rpm for about 5 minutes until sufficiently uniformly flowable.

75.7 g of the aluminum premix were added to the blend of polymer premix and glass fits and the combination was stirred for 5 more minutes, followed by further mixing using a high shear homogenizer at 20,000 rpm for 1-2 minutes to obtain the transferable conductive composition.

3.4. Preparation of a Transferable Composition Using an Alternative Aluminum Premix The aluminum premix was prepared as described in Example 3.3, using Hostaphat® 1306 as a dispersing agent instead of Crodafos™ O3A-LQ-(RB), according to the following quantities: Isopar™ M: 12.1 g; Hostaphat® 1306: 0.6 g; Aluminum powder (1-2 μm): 29.1 g; Aluminum powder (5-6 μm): 58.2 g.

75 g of the aluminum premix was then combined with the heated Bynel® 3861 polymer premix already supplemented with glass frits, according to Example 3.3, using the following quantities: Bynel® 3861 polymer premix: 23 g; glass frits (V2083): 1 g; glass frits (ASF-1100B): 1 g.

3.5. Preparation of a Transferable Composition Using a Glass Fits Premix

In a separate 200 ml glass container, 12.5 g of Isopar™ M and 0.5 g of Crodafos™ O3A-LQ-(RB) were placed and mixed by an overhead stirrer, followed by the gradual addition of 87 g of glass frits (first 43.5 g of V2083 and then 43.5 g of ASF-1100B), and mixing using a high shear homogenizer at 20,000 rpm for 1-2 minutes to obtain a glass frits premix.

31.5 g of the heated Bynel® 3861 polymer premix according to Example 3.1 were then placed in another 300 ml glass container, and 2 g of the glass frits premix were added. The container was placed in a heating mantle at about 80-90° C., and its contents were mixed with an overhead stirrer at about 800-2,300 rpm for about 5 minutes until sufficiently uniformly flowable.

66.5 g of aluminum powders were then gradually added to the blend of swollen polymer and glass fits (first 22 g of a powder having an average size of 1-2 μm and then 44.5 g of a powder having an average size of 5-6 μm) and stirred for additional 5 minutes, followed by further mixing using a high shear homogenizer at 20,000 rpm for 1-2 minutes to obtain the transferable conductive composition.

The transferable compositions prepared according to the above-described alternative methods are summarized in Table 7. Their composition is presented in % vol. of the components by total solid volume, calculated as explained in Example 1.2 and Table 3. For the glass frits, the volume concentration was calculated based on the cumulative volume of the aluminium particles.

TABLE 7

| | Ex. 3.2 | | | | | |
| Component | Comp. I | Comp. II | Comp. III | Ex. 3.3 | Ex. 3.4 | Ex. 3.5 |
| --- | --- | --- | --- | --- | --- | --- |
| Bynel ® 3861 | 19.7 | 18.3 | 17.6 | 20.1 | 20.6 | 25.7 |
| Aluminum | 79.4 | 81.0 | 81.2 | 78.8 | 79.3 | 73.4 |
| Glass frits (*) | 1.2 | 1.0 | 1.5 | 1.3 | 1.4 | 1.2 |

(*) The vol. % of glass frits is calculated with respect to the volume of all aluminum powders Without wishing to be bound by any particular theory, it is believed that preparing the transferable compositions according to the present teachings by blending a number of premixes of the major ingredients, may facilitate the preparation of each premix with compounds compatible with another in the premix, and in turn assist in the optimization of composition combining the individual premixes.

Example 4: Application of a Transferable Composition by Coating

In the present example, a thin flexible sheet of polyethylene was used to illustrate a transfer membrane upon which transferable compositions, such as prepared according to Examples 1 to 3, can be applied. The flexible membrane was first pre-coated with a film-forming ethylcellulose, so as to facilitate later release/transfer of the pattern.

4.1 Coating of PET Sheet with Ethylcellulose 190 g of 1-pentanol were placed in a 250 ml glass container, and 10 g of Ethocel™ 100, as releasing agent, were added gradually while stirring using a magnetic stirrer until a clear solution was obtained. The Ethocel™ 100 solution was manually applied by wiping on a sheet of flexible transparent polyethylene (PET, 36 μm thickness, from Jolybar, Israel) using a 6 μm Wire Wound Lab Rod. The PET sheet so coated was maintained at room temperature overnight, allowing the organic solvent to evaporate and the ethylcellulose coating to dry to form a film having a thickness of about 1 μm. For brevity, such illustrative transfer membrane shall be referred to as a pre-treated PET sheet in the following.

4.2. Coating of Pre-Treated PET by Transferable Compositions

The pre-treated PET sheet was placed on a vacuum automatic film applicator, equipped with a 60 μm wire rod bar, preheated to 80° C. The vacuum automatic film applicator was rear-heated to 80° C., and top-heated by an IR heater to 60-80° C.

The transferable compositions prepared in Example 1 were pre-heated in a drying oven to about 100° C. to restore flowability. Each was applied onto a pre-treated and pre-heated PET sheet in a sufficient amount so as to cover when spread the majority of the sheet surface, and then cast using the wire rod at a speed of 15 mm/sec. Each one of the coated sheets was then maintained on the vacuum automatic film applicator for 20 more seconds to allow partial evaporation of the solvent and enhance fixation of the coating on the sheet. Typically, upon partial elimination of the swelling agent, a layer about 35-40 μm thick and having the shape of a rectangle of about 200*300 mm was formed.

Example 5: Application of a Transferable Composition by Screen-Printing

A pre-treated sheet of flexible transparent polyethylene coated with Ethocel™ 100, prepared as described in Example 4.1, was placed on a vacuum automatic film applicator and top and rear-heated to about 80° C. A mesh screen (polyester α-series EX 43-080/110 PW by NBC, China), coated with a polymer screen emulsion (Fotecoat 1090 by Foteco, Italy), so as to form in a series of experiments a mask allowing passage of a designed pattern, was placed on the pre-treated PET sheet.

The transferable conductive compositions prepared in Example 1 were pre-heated in a drying oven to about 100° C. as described in Example 4.2. Once flowable, each composition was applied onto the mesh screen and then screen-printed manually, using a polyurethane screen printer squeegee, so as to form the designed pattern of lines or a layer having a dry thickness of about 35-40 μm.

Additionally, the transferable compositions prepared according to Examples 1 to 3 were printed on pre-treated PET sheets using, alternatively, an industrial flat screen printer heated to a temperature of 80° C. by an IR heater, whereby a layer of about 35-40 μm thickness was formed.

Example 6: Transfer of a Pattern from a Membrane to a BSF Solar Cell Wafer

The flexible PET sheet, including the aluminum patterns prepared from the various transferable compositions comprising the swellable polymers (see Examples 1 to 3) and applied by alternative coating methods (see Examples 4 and 5), was contacted with a surface of suitable substrate. In the present example, the surface upon which the various samples of transfer membranes were placed was the back side of a textured silicon wafer having a phosphor-doped emitter front side and a boron-doped silicon on the back side. The silicon wafer used in the present example (manufactured by Yangli Solar, China) was a standard BSF c-Si cell having a square shape of about 156 mm side and a thickness of about 175 In part of the experiments, the silicon wafer already included a standard 5BB grid-like electrode on its front side prior to the application of a transfer membrane to its other side. The sheets bearing the patterns made from the different transferable compositions were pressed against the wafers' back side at a pressure of 6 Kg/cm², by passing them at a speed of 1.6 m/min through a standard pair of rubber rollers, with the pressure rollers heated to about 100-130° C. The silicon wafers were then allowed to cool back to ambient temperature, each of the various transfer membranes still being attached to the backside surface of each substrate and the respective aluminum pattern (e.g., a continuous coating) adhered thereto. The PET sheet was then peeled off the wafer, while the pattern transferred to the wafer remained thereon following the removal of the sheet. The transferred aluminum coating was then sintered and fired upon the wafer in a solar belt furnace running at 550 cm/min with a temperature profile passing through a drying phase for approximately 30 seconds at about 250° C., a burning phase for approximately 20 seconds between about 450° C. and 550° C. and reaching a peak temperature of about 860° C. for about 15 seconds, so as to yield an electrically conductive pattern on the substrate. The sintering profile described above with regards to the BSF c-Si cell is exemplary. Temperature profiles that are suitable for various cell types and/or compositions intended to be sintered can be devised by anyone of skill in the field of solar cells.

Example 7: Alternative Transferable Compositions and Substrate Surfaces

While Examples 1-6 have detailed the preparation of transferable compositions comprising aluminum particles, their application to transfer membranes and their transfer to a back side of a silicon wafer suitable as solar cell substrate, the present teachings are not limited to this particular type of conductive particles, nor to a specific pattern or side of a substrate, as shall be shown in the present example.

7.1 Preparation of a Swelled Polymer Premix 20 g of Bynel® 3861 and 80 g of Isopar™ M were placed in a 100 ml closed glass container, equipped with a condenser to prevent or reduce solvent evaporation. The obtained mixture was heated, using a heating mantle, to about 150-160° C., while stirring with an overhead stirrer at about 800-2,000 rpm, until a clear solution of swollen polymer was obtained. The solution was maintained in a closed container at room temperature for at least 2 hours, allowing the premix of swollen polymer to cool down, at which time a whitish, dense, rubber-like composition was obtained.

7.2 Preparation of a Transferable Conductive Composition Including Silver Powder 19.5 g of the polymer premix obtained in previous step was placed in a 300 ml glass container. The swollen polymer was heated, using a heating mantle, to about 80-90° C., until sufficient softening. 2.3 g of dispersant, Servoxyl® VPTZ 100, were gradually added while stirring, using an overhead stirrer at about 800-2,300 rpm, and the resulting mixture was maintained under continued stirring for additional 1-2 minutes until a homogeneous dispersion of the surfactant was obtained. 128.3 g of silver powder were gradually mixed-in under stirring, and the resulting mixture was maintained under continuing stirring for 5 more minutes until a homogeneous dispersion of the silver particles within the swollen polymer was obtained. The resulting dispersion was maintained in a closed glass container at room temperature for 2-3 hours, allowing it to cool down, then forming a grey rubbery silver paste. No glass frits were added to the formulation.

The silver paste transferable composition was re-heated and screen-printed manually on a flexible transparent sheet of siliconized PET (Cat. no. 942018, 30 μm thickness, by Nirotek, Israel) as described in Example 5. In the present example, the PET sheet was pre-treated by the manufacturer to be siliconized, such outer layer serving to facilitate later release of the pattern. The printed pattern, which appeared as an array of spaced apart lines, was then applied onto a front side of a solar cell wafer and transferred thereto, as described in Example 6. Following peeling away of the PET sheet, confirming the transferability of the composition, the pattern was not sintered on the wafer.

Example 8: Electrical Properties of Standard BSF Solar Cells with Transferred Patterns The ability of patterns sintered upon solar substrates as described in Example 6 to conduct electricity was measured as follows with an I-V tester including a software capable of extracting from the acquired data the $V_{OC}$, Jsc, FF, and Efficiency of a tested solar cell.

A BSF solar cell having on its front side a standard 5BB grid-like electrode directly applied by the manufacturer (Yingli Solar, China) was coated on its rear side by a pattern of transferrable composition transferred from a membrane prepared and used as previously described. The solar cell being tested, with sintered electrodes on both sides, was isolated from devices able to cause electrical interference and placed in a light box with its back surface facing a holder. Its solar harvesting front side was exposed to a light source positioned at a distance providing an exposure of 1000 W/m², the incident radiation being substantially perpendicular to the front surface. A probe having an array of contacts aligned with the termini of solar cells front side conductor was applied upon the front electrode, enabling contact with similarly arrayed contacts positioned beneath the back electrode. Measurements were made when the solar cell was suitably contacted on both of its sides by the relevant probes allowing closing an electrical circuit between the commercially applied front electrode and the back electrode prepared and applied according to the present teachings. Measurements of voltage across the two electrodes in absence of current were made while the solar cell was maintained at about 25° C. and the $V_{OC}$ recorded in at least three repeat experiments. The average of all values for patterns/BSF cells formed by each transferable composition is reported in Table 8. For comparison, the $V_{OC}$ of a commercially available solar cell with a similar front electrode, but a conventionally applied back electrode (Yingli Solar, China) was measured by the same method and found to be 625 mV.

TABLE 8

| Swellable polymer of the transferred pattern | $V_{OC}$ [mV] |
|---|---|
| Bynel ® 3101 | 594 |
| Bynel ® 3861 | 609 (Ex. 1.2) |
| | 620 (Ex. 2.2.1) |
| | 625 (Ex. 3.2, Comp. II) |
| CrystaSense ™ LP1 | N/A |
| Elvax ™ 350 | 597 |
| Elvax ™ 410 | 594 |
| Elvax ™ 420 | 597 |
| Elvax ™ 470 | 603 |
| Elvax ™ 670 | 601 |
| Lotader ® 4700 | 600 |

Example 9: Electrical Properties of PERC Solar Cells with Transferred Patterns Patterns of transferable compositions transferred to PERC cells and sintered thereon were tested for their electrical activity.

P-type PERC cells (supplied by Trina Solar, China, and having on their front side a standard 5BB grid-like electrode directly applied by the manufacturer with front metallization, and their back side being non-metalized and laser-perforated to create openings of 1 mm by 30 microns) were coated on their rear sides by a pattern of transferrable compositions, and further sintered as described in Example 6 for BSF cells.

A commercial standard p-type PERC cell, having a similar front electrode and its back side electrode pre-applied by the manufacturer (Trina Solar, China) was used as reference.

The compositions of the analyzed patterns/PERC cells were as follows:

9.1. The transferable conductive composition prepared in Example 2.2.2;

9.2. The transferable conductive composition prepared in Example 2.2.4;

9.3. The transferable conductive composition prepared in Example 2.2.5;

9.4. Transferable conductive composition III prepared in Example 3.2;

9.5. The transferable conductive composition prepared in Example 3.4;

9.6. A commercially available aluminum paste composition (BL02A, provided by Leed-Ink, China);

9.7. A modified version of a the commercially paste wherein the original resin was replaced by a swellable polymer according to the present teaching.

The replacement was performed as follows: commercially available BL02A aluminum paste was mixed with excess amount of isopropyl alcohol so as to wash out the original resin. The mixture was stirred for about 20 minutes at RT, then centrifuged to separate the solids of the commercial paste from the washing solvent. The washing step was repeated two to four more times, and the solids of the last washing step were then dried in an oven at about 80° C. for at least 3 hours, so that mainly glass frits remained in the paste;

87 g of the washed and dried paste were then dispersed in 12.7 g of Isopar™ M and 0.3 g Crodafos™ O10A by ball milling at 100-250 rpm for 12 hours;

71.2 g of the dispersed paste were placed in a separate container, and 28 g of the polymer premix containing Bynel® 3861 prepared according to Example 2.1.3 and kept at a temperature of 80-90° C. were added. Additional 0.8 g Isopar™ M were also added, and the obtained mixture was mixed using an overhead stirrer for five minutes at 2,000 rpm.

Compositions 9.1-9.5 and 9.7 were screen printed on flexible transparent polyethylene sheets pre-treated with Ethocel™ 100 according to Example 5 and transferred to the back side of PERC cell wafers, as described in Example 6 for BSF cells.

Composition 9.6 was screen printed directly on a PERC cell wafer, using the same screen as the compositions of the invention, to yield a similar pattern.

The $V_{OC}$ results of the PERC cells were measured using Suns-$V_{OC}$ I-V tester, and the sheet resistance of the transferred or applied patterns were measured using a 4-terminal resistance meter. The results are summarized in Table 9.

TABLE 9

| Example | $V_{OC}$ [mV] | Sheet resistance [mΩ] |
| --- | --- | --- |
| Reference | 664 | 20 |
| 9.1 | 653 | 6 |
| 9.2 | 660 | 2-10 |
| 9.3 | 660-662 | 13-19 |
| 9.4 | 666 | 13 |
| 9.5 | 660-662 | 9-11 |
| 9.6 | 656-658 | 20-27 |
| 9.7 | 656 | 20 |

The $V_{OC}$ results demonstrate that the efficiency of the PERC cells produced using the transferable compositions of the present invention (Ex. 9.1-9.5) are comparable with and may even surpass the $V_{OC}$ of a commercial cell serving as reference. Sheet resistance values of the patterns formed by the compositions of the present invention are also comparable, and sometimes even favorable, being lower than the values yielded by commercial products, indicating a higher efficiency contributed inter alia by the compositions of the present invention and the patterns they can in turn form and transfer.

The commercial composition, whose polymer content was replaced by the swelled polymers of the present invention (Ex. 9.7), enabled the transfer and formation of a pattern that yielded on a PERC cell $V_{OC}$ results comparable to the original commercial paste directly screen printed (Ex. 9.6). The sheet resistances provided by the two conductive patterns seem also similar.

Unless otherwise defined or understood from the disclosure herein, all technical and scientific terms used herein have the same meaning as commonly understood by one of ordinary skill in the art to which the present disclosure pertains.

It is appreciated that certain features of the presently disclosed subject matter, which are, for clarity, described in the context of separate or different embodiments, may also be provided in combination in a single or same embodiment. Conversely, various features of the presently disclosed subject matter, which are, for brevity, described in the context of a same embodiment, may also be provided separately or in any suitable sub-combination or as suitable in any other described embodiment of the disclosure. Certain features described in the context of various embodiments are not to be considered essential features of those embodiments, unless the embodiment is inoperative without those features.

Although the present disclosure has been described with respect to various specific embodiments presented thereof for the sake of illustration only, such specifically disclosed embodiments should not be considered limiting. Many other alternatives, modifications, alterations, permutations, and variations of such embodiments and features thereof will be apparent to those skilled in the art based upon Applicant's disclosure herein. Accordingly, it is intended to embrace all such alternatives, modifications and variations, and any change which come within their meaning and range of equivalency.

Unless otherwise stated, the use of the expression "and/or" between the last two members of a list of options for selection indicates that a selection of one or more of the listed options is appropriate and may be made.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments. Furthermore, a feature which is described as preferred or advantageous in some embodiments, may not necessarily be preferred or advantageous in other embodiments.

In the description and claims of the present disclosure, each of the verbs "comprise", "include" and "have", and conjugates thereof, are used to indicate that the object or objects of the verb are not necessarily a complete listing of features, members, steps, components, elements or parts of the subject or subjects of the verb.

As used herein, the singular form "a", "an" and "the" include plural references and mean "at least one" or "one or more" unless the context clearly dictates otherwise. At least one of A and B is intended to mean either A or B, and may mean, in some embodiments, A and B.

Positional or motional terms such as "upper", "lower", "right", "left", "bottom", "below", "lowered", "low", "top", "above", "elevated", "high", "back", "front", "side", "vertical", "horizontal", "backward", "forward", "upstream" and "downstream", as well as grammatical variations thereof, may be used herein for exemplary purposes only, to illustrate the relative positioning, placement or displacement of certain components, to indicate a first and a second component in present illustrations or to do both. Such terms do not necessarily indicate that, for example, a "bottom" component is below a "top" component, as such directions, components or both may be flipped, rotated, moved in space, placed in a diagonal orientation or position, placed horizontally or vertically, or similarly modified.

Unless otherwise stated, when the outer bounds of a range with respect to a feature of an embodiment of the present technology are noted in the disclosure, it should be understood that in the embodiment, the possible values of the feature may include the noted outer bounds as well as values in between the noted outer bounds.

As used herein, unless otherwise stated, adjectives such as "substantially", "approximately" and "about" that modify a condition or relationship characteristic of a feature or features of an embodiment of the presently disclosed subject matter, are to be understood to mean that the condition or characteristic is defined to within tolerances that are acceptable for operation of the embodiment for an application for which it is intended, or within variations expected from the measurement being performed and/or from the measuring instrument being used. When the term "about" and "approximately" precedes a numerical value, it is intended to indicate +/−15%, or +/−10%, or even only +/−5%, or any other suitable +/− variation within such ranges, and in some instances the precise value. Furthermore, unless otherwise stated, the terms (e.g., numbers) used in an embodiment of the presently disclosed subject matter, even without such adjectives, should be construed as having tolerances which may depart from the precise meaning of the relevant term but would enable the embodiment or a relevant portion thereof to operate and function as described, and as understood by a person skilled in the art.

To the extent necessary to understand or complete the disclosure of the present disclosure, all publications, patents, and patent applications mentioned herein, including in particular the applications of the Applicant, are expressly incorporated by reference in their entirety as is fully set forth herein. Citation or identification of any reference in this application shall not be construed as an admission that such reference is available as prior art to the disclosure.

Certain marks referenced herein may be common law or registered trademarks of third parties. Use of these marks is by way of example and shall not be construed as descriptive or limit the scope of this disclosure to material associated only with such marks.

The invention claimed is:

1. A method for preparing a transferable conductive composition, the method comprising:
   a) providing a polymer premix containing a swellable polymer swelled with a swelling agent, the swellable polymer being a thermoplastic polymer not miscible within the swelling agent; the polymer premix being at a temperature greater than a softening temperature of the swellable polymer; and
   b) mixing the polymer premix of step a) with particles of an electrically conductive material, the mixing being performed at a temperature of at least 50° C. and at most 250° C. and configured to uniformly disperse the electrically conductive particles within the polymer premix so as to obtain the transferable conductive composition in the form of a homogeneous matrix.

2. The method of claim 1, wherein the polymer premix of step a) is prepared by combining the swellable polymer with the swelling agent to obtain a mixture, and heating said mixture until complete melting of the swellable polymer, a temperature of heating being at least 20° C. higher than the polymer melting point, and at least 40° C. lower than the swelling agent boiling point.

3. The method of claim 1, further comprising adding at least one of glass frits, a rheological modifier, a dispersing agent and a water-protective agent.

4. The method of claim 2, wherein the swellable polymer is combined with the swelling agent at a weight per weight ratio of the swellable polymer to the swelling agent, SP/SA, in a range between 1:99 and 9:1.

5. A method of manufacturing a transfer membrane suitable for applying a pattern of electrical conductors to a substrate, the method comprising:
   a) applying with an applicator onto a surface of a transfer membrane or within grooves therein a transferable conductive composition comprising a swellable polymer swelled with a swelling agent, the swellable polymer being a thermoplastic polymer not miscible within the swelling agent, and electrically conductive particles uniformly dispersed therein, the transferable conductive composition being applied at an application temperature sufficiently elevated for the composition to be flowable enough to be applied by the applicator; and
   b) allowing the temperature of the transfer membrane to be reduced, so that the pattern of the transferable conductive composition applied thereto is sufficiently attached to the membrane the transferable conductive composition forming a homogeneous matrix.

6. The method of claim 5, wherein the transferable conductive composition further contains at least one of glass frits, a rheological modifier, a dispersing agent and a water-protective agent.

7. The method of claim 5, wherein the transferable conductive composition is applied to the transfer membrane by applying shear, and the composition has a shear thinning behavior, such that at a shear rate of at least $150 \text{ s}^{-1}$ and a temperature of about 80° C., the composition viscosity decreases by at least one order of magnitude.

8. The method of claim 1, wherein the swellable thermoplastic polymer is selected from a group consisting of ethylene/vinyl acetate (EVA) co-polymer, acid modified ethylene acrylate resin, ethylene/acrylic ester/maleic anhydride ter-polymer, polyvinyl butyral, polyvinyl alcohol and polyamide.

9. The method of claim 1, wherein the swellable thermoplastic polymer has at least one of a) a melt flow rate, as measured at 190° C. with a load of 2.16 kg, within a range of 0.2 g/10 min to 500 g/10 min; and b) a Vicat softening temperature within the range of 30° C. to 140° C.

10. The method of claim 1, wherein the swelling agent is selected from a group consisting of $C_{6-20}$ isoparaffins, $C_{3-10}$ ketones, $C_{1-12}$ alcohols, $C_{6-10}$ aromatic hydrocarbons, glycerin, water and combinations thereof.

11. The method of claim 1, wherein the swelling agent can dissolve no more than 10 wt. % of the swellable polymer by weight of the swellable polymer.

12. The method of claim 1, wherein the swelling agent has at least one of a) a boiling temperature within a range of 90° C. to 450° C.; and b) a vapor pressure within a range of $10^{-6}$ kPa to 5 kPa.

13. The method of claim 1, wherein the electrically conductive material is selected from a group consisting of metals, alloys, organo-metals, and of oxides, precursors, hydrates and/or salts thereof; and of conductive polymers.

14. The method of claim 1, wherein the thermoplastic swellable polymer is present in the transferable conductive composition at a volume concentration within a range of 2 vol. % to 25 vol. % by volume of all solids and the electrically conductive particles are present in the transferable conductive composition at a volume concentration within a range of 65 vol. % to 98 vol. % by volume of all solids.

15. The method of claim 5, wherein the swellable thermoplastic polymer has at least one of a) a melt flow rate, as measured at 190° C. with a load of 2.16 kg, within a range of 0.2 g/10 min to 500 g/10 min; and b) a Vicat softening temperature within the range of 30° C. to 140° C.; and is selected from a group consisting of ethylene/vinyl acetate (EVA) co-polymer, acid modified ethylene acrylate resin, ethylene/acrylic ester/maleic anhydride ter-polymer, polyvinyl butyral, polyvinyl alcohol and polyamide.

16. The method of claim 5, wherein the swelling agent has at least one of a) a boiling temperature within a range of 90° C. to 450° C.; and b) a vapor pressure within a range of $10^{-6}$ kPa to 5 kPa; and is selected from a group consisting of $C_{6-20}$ isoparaffins, $C_{3-10}$ ketones, $C_{1-12}$ alcohols, $C_{6-10}$ aromatic hydrocarbons, glycerin, water and combinations thereof.

17. The method of claim 5, wherein the electrically conductive particles comprise a material selected from a group consisting of metals, alloys, organo-metals, and of oxides, precursors, hydrates and/or salts thereof; and of conductive polymers.

*   *   *   *   *